US012769213B2

(12) United States Patent
Zheng et al.

(10) Patent No.: US 12,769,213 B2
(45) Date of Patent: Oct. 20, 2026

(54) METHODS FOR IMPROVING PROCESS BASED CONTOUR INFORMATION OF STRUCTURE IN IMAGE

(71) Applicant: ASML NETHERLANDS B.V., Veldhoven (NL)

(72) Inventors: Yunan Zheng, Fremont, CA (US); Yongfa Fan, Sunnyvale, CA (US); Mu Feng, San Jose, CA (US); Leiwu Zheng, San Jose, CA (US); Jen-Shiang Wang, Sunnyvale, CA (US); Ya Luo, Saratoga, CA (US); Chenji Zhang, San Jose, CA (US); Jun Chen, San Jose, CA (US); Zhenyu Hou, San Jose, CA (US); Jinze Wang, Shenzhen (CN); Feng Chen, San Jose, CA (US); Ziyang Ma, Mountain View, CA (US); Xin Guo, Sunnyvale, CA (US); Jin Cheng, Santa Clara, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 845 days.

(21) Appl. No.: 17/636,103

(22) PCT Filed: Aug. 1, 2020

(86) PCT No.: PCT/EP2020/071742
§ 371 (c)(1),
(2) Date: Feb. 17, 2022

(87) PCT Pub. No.: WO2021/032448
PCT Pub. Date: Feb. 25, 2021

(65) Prior Publication Data

US 2022/0299881 A1 Sep. 22, 2022

Related U.S. Application Data

(60) Provisional application No. 62/889,248, filed on Aug. 20, 2019.

(30) Foreign Application Priority Data

Apr. 20, 2020 (WO) ................ PCT/CN2020/085643

(51) Int. Cl.
*G03F 7/00* (2006.01)

(52) U.S. Cl.
CPC .......... *G03F 7/705* (2013.01); *G03F 7/70525* (2013.01); *G03F 7/70625* (2013.01)

(58) Field of Classification Search
CPC ............................. G03F 7/705; G03F 7/70525
(Continued)

(56) References Cited

U.S. PATENT DOCUMENTS

| | | | | |
|---|---|---|---|---|
| 7,587,704 B2 | 9/2009 | Ye et al. | | |
| 8,887,105 B1 * | 11/2014 | Bruguier | G03F 1/70 716/51 | |

(Continued)

FOREIGN PATENT DOCUMENTS

| | | |
|---|---|---|
| CN | 110088687 | 8/2019 |
| JP | 2014206550 | 10/2014 |

(Continued)

OTHER PUBLICATIONS

International Search Report and Written Opinion issued in corresponding PCT Patent Application No. PCT/EP2020/071742, dated Nov. 11, 2020.

(Continued)

*Primary Examiner* — Suchin Parihar
(74) *Attorney, Agent, or Firm* — Pillsbury Winthrop Shaw Pittman LLP

(57) ABSTRACT

A method for generating modified contours and/or generating metrology gauges based on the modified contours. A method of generating metrology gauges for measuring a physical characteristic of a structure on a substrate includes
(Continued)

obtaining (i) measured data associated with the physical characteristic of the structure printed on the substrate, and (ii) at least portion of a simulated contour of the structure, the at least a portion of the simulated contour being associated with the measured data; modifying, based on the measured data, the at least a portion of the simulated contour of the structure; and generating the metrology gauges on or adjacent to the modified at least a portion of the simulated contour, the metrology gauges being placed to measure the physical characteristic of the simulated contour of the structure.

20 Claims, 24 Drawing Sheets

(58) Field of Classification Search
USPC .......................................................... 716/55
See application file for complete search history.

(56) References Cited

U.S. PATENT DOCUMENTS

| | | | | |
|---|---|---|---|---|
| 10,137,643 | B2 | 11/2018 | Cao et al. | |
| 10,453,758 | B2 | 10/2019 | Van Leest et al. | |
| 2009/0157360 | A1 | 6/2009 | Ye et al. | |
| 2009/0300573 | A1* | 12/2009 | Cao | B29C 64/386 716/50 |
| 2010/0218161 | A1* | 8/2010 | Sahouria | G03F 1/68 716/54 |
| 2011/0202893 | A1* | 8/2011 | Kusnadi | G03F 1/36 716/53 |
| 2011/0202898 | A1* | 8/2011 | Kusnadi | G03F 7/70516 716/135 |
| 2012/0098954 | A1* | 4/2012 | Yamaguchi | H01L 22/12 382/145 |
| 2012/0117520 | A1 | 5/2012 | Kitamura et al. | |
| 2012/0202351 | A1* | 8/2012 | Cha | G03F 1/00 438/758 |
| 2013/0223723 | A1* | 8/2013 | Shibahara | G01B 21/20 382/145 |
| 2015/0228063 | A1* | 8/2015 | Minakawa | G06T 7/0002 382/151 |
| 2016/0283617 | A1* | 9/2016 | Bailey | G03F 7/70616 |
| 2016/0313651 | A1 | 10/2016 | Middlebrooks et al. | |
| 2018/0053291 | A1* | 2/2018 | Ma | G06T 11/00 |
| 2018/0101637 | A1 | 4/2018 | Kim et al. | |
| 2019/0025705 | A1 | 1/2019 | Van Der Laan et al. | |
| 2019/0094680 | A1* | 3/2019 | Huang | G03F 1/80 |
| 2019/0147127 | A1 | 5/2019 | Su et al. | |
| 2019/0310554 | A1 | 10/2019 | Middlebrooks et al. | |
| 2020/0103747 | A1* | 4/2020 | Huang | G03F 7/26 |
| 2020/0320238 | A1* | 10/2020 | Batistakis | G03F 7/705 |
| 2021/0072635 | A1* | 3/2021 | Ma | G03F 7/705 |

FOREIGN PATENT DOCUMENTS

| | | |
|---|---|---|
| KR | 10-2018-0166384 | 10/2018 |
| TW | I460547 | 11/2014 |
| TW | 201530333 | 8/2015 |
| TW | 201741762 | 12/2017 |

OTHER PUBLICATIONS

Office Action issued in corresponding Chinese Patent Application No. 202080058841.1, dated Jan. 23, 2024.

Office Action issued in corresponding Korean Patent Application No. 10-2022-7005626, dated Aug. 2, 2024.

* cited by examiner

METHODS FOR IMPROVING PROCESS BASED CONTOUR INFORMATION OF STRUCTURE IN IMAGE

CROSS-REFERENCE TO RELATED APPLICATIONS

This application is the U.S. national phase entry of PCT Patent Application No. PCT/EP2020/071742 which was filed on Aug. 1, 2020, which claims the benefit of priority of U.S. Provisional Application No. 62/889,248 which was filed on Aug. 20, 2019, and of PCT Patent Application No. PCT/CN2020/085643 which was filed on Apr. 20, 2020 which are incorporated herein in their entireties by reference.

FIELD

The present disclosure relates to techniques of improving the performance of metrology tool and a device manufacturing process. The techniques may be used in connection with a lithographic apparatus metrology related to the device manufacturing, or manufacturing process based on contour information.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

SUMMARY

In an embodiment, there is provided a method of generating metrology gauges for measuring a physical characteristic of a structure on a substrate. The method includes obtaining (i) measured data associated with the physical characteristic of the structure printed on the substrate, and (ii) at least portion of a simulated contour of the structure, the portion of the simulated contour being associated with the measured data; modifying, based on the measured data, the portion of the simulated contour of the structure; and generating the metrology gauges on or adjacent to the modified portion of the simulated contour, the metrology gauges being placed to measure the physical characteristic of the simulated contour of the structure.

Furthermore, in an embodiment, there is provided a method for determining hotspot locations associated with a substrate. The method includes obtaining (i) a simulated contour associated with one or more patterns, the simulated contour being associated with measured data of a physical characteristic of the one or more patterns printed on the substrate, and (ii) metrology gauges associated with the simulated contour; determining, based on the metrology gauges, values of the physical characteristic associated with the one or more patterns; and determining, based on the physical characteristic values, the hotspot locations on the substrate, wherein a hotspot location is a location on the substrate where a physical characteristic value is less than a hotspot threshold value associated with the one or more patterns.

Furthermore, in an embodiment, there is provided a method for training a model associated with a patterning process. The method includes obtaining (i) measured data associated with the physical characteristic of the structure printed on the substrate, and (ii) metrology gauges associated with a simulated contour of a structure to be printed on a substrate, the simulated contour being associated with a defined location on the substrate where the physical characteristic is measured; and training, using the measured data and the metrology gauges, the model such that a performance metric of the patterning process is improved around the defined location on the substrate, the performance metric being a function of the metrology gauges and the physical characteristic.

Furthermore, in an embodiment, there is provided a method of generating metrology gauges for measuring a physical characteristic of a structure on a substrate, the method includes obtaining (i) measured data associated with the physical characteristic of the structure printed on the substrate, and (ii) at least portion of a simulated contour of the structure, the portion of the simulated contour being associated with the measured data; generating, based on the measured data, a modified contour of the portion of the simulated contour of the structure; and providing the modified contour to a model of the patterning process to determine parameters of the patterning process.

Furthermore, in an embodiment, there is provided a computer program product comprising a non-transitory computer readable medium having instructions recorded thereon, the instructions when executed by a computer system implementing the aforementioned methods.

Furthermore, in an embodiment, there is provided a method of training a machine learning model associated with a patterning process. The method including obtaining (i) contour data of an after development image (ADI) pattern on a substrate, (ii) measured data of an after etch image (AEI) pattern printed on the substrate, and (iii) reference bias values based on the contour data of the ADI pattern and the measured data of the AEI pattern; and training, using the measured data and the contour data as training data, the machine learning model to determine bias values to be applied to an ADI contour.

Furthermore, in an embodiment, there is provided a method for determining a bias vector associated with an after development image (ADI) pattern. The method including obtaining (i) a probability distribution function (PDF) corresponding to particles deposited within the ADI pattern on a substrate, and (ii) a contour function characterizing an ADI contour associated with the ADI pattern; determining, based on a combination of the PDF of the particles and the contour function over an area of the ADI contour, a deposition rate of the particles at a specified location on the ADI contour; and determining, based on the deposition rate, a bias vector associated with the ADI pattern, the bias vector when applied to the ADI contour of the ADI pattern generates an after etch image (AEI) contour.

Furthermore, in an embodiment, there is provided a method for determining a bias vector for a contour. The method includes obtaining (i) a probability distribution function (PDF) corresponding to a process to be performed on the contour, and (ii) a contour function characterizing a shape of the contour; convoluting the contour function with the PDF over an area of the contour to determine a process rate at a specified location on the contour; and determining, based on the process rate, a bias vector to be applied to the contour for generating a biased contour that is indicative of an effect of the process applied on the contour.

Furthermore, in an embodiment, there is provided a non-transitory computer-readable media comprising instructions that, when executed by one or more processors, cause operations of the method steps discussed herein

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
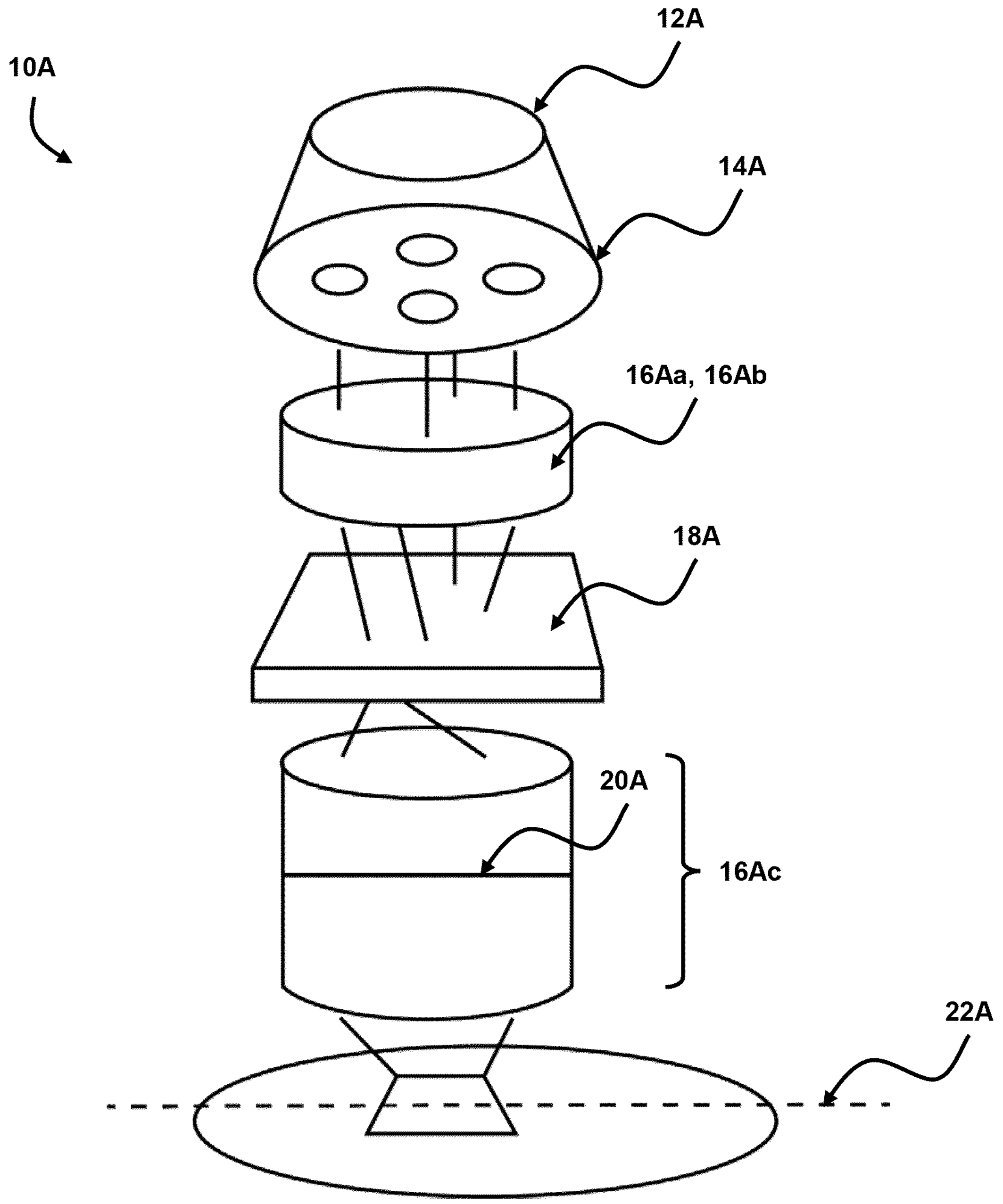
FIG. 1 shows a block diagram of various subsystems of a lithography system, according to an embodiment.

FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=n \sin(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

In an embodiment, assist features (sub resolution assist features and/or printable resolution assist features) may be placed into the design layout based on how the design layout optimized according to the methods of the present disclosure. For example, in an embodiment, the methods employ a machine learning based model to determine a patterning device pattern. The machine learning model may be a neural network such as a convolution neural network that can be trained in a certain way (e.g., as discussed in FIG. 3) to obtain accurate predictions at a fast rate, thus enabling a full-chip simulation of the patterning process.

A neural network may be trained (i.e., whose parameters are determined) using a set of training data. The training data may comprise or consist of a set of training samples. Each sample may be a pair comprising or consisting of an input object (typically a vector, which may be called a feature vector) and a desired output value (also called the supervisory signal). A training algorithm analyzes the training data and adjusts the behavior of the neural network by adjusting the parameters (e.g., weights of one or more layers) of the neural network based on the training data. The neural network after training can be used for mapping new samples.

In the context of determining a patterning device pattern, the feature vector may include one or more characteristics (e.g., shape, arrangement, size, etc.) of the design layout comprised or formed by the patterning device, one or more characteristics (e.g., one or more physical properties such as a dimension, a refractive index, material composition, etc.) of the patterning device, and one or more characteristics (e.g., the wavelength) of the illumination used in the lithographic process. The supervisory signal may include one or more characteristics of the patterning device pattern (e.g., CD, contour, etc. of the patterning device pattern).

Given a set of N training samples of the form $\{(x_1, y_1), (x_2, y_2), \ldots, (x_N, y_N)\}$ such that $x_i$ is the feature vector of the i-th example and $y_i$ is its supervisory signal, a training algorithm seeks a neural network g: $X \rightarrow Y$, where X is the input space and Y is the output space. A feature vector is an n-dimensional vector of numerical features that represent some object. The vector space associated with these vectors is often called the feature space. It is sometimes convenient to represent g using a scoring function f: $X \times Y \rightarrow \mathbb{R}$ such that g is defined as returning the y value that gives the highest score:

$$g(x) = \arg\max_y f(x, y).$$

Let F denote the space of scoring functions.

The neural network may be probabilistic where g takes the form of a conditional probability model $g(x)=P(y|x)$, or f takes the form of a joint probability model $f(x, y)=P(x, y)$.

There are two basic approaches to choosing f or g: empirical risk minimization and structural risk minimization. Empirical risk minimization seeks the neural network that best fits the training data. Structural risk minimization includes a penalty function that controls the bias/variance tradeoff. For example, in an embodiment, the penalty function may be based on a cost function, which may be a squared error, number of defects, EPE, etc. The functions (or weights within the function) may be modified so that the variance is reduced or minimized.

In both cases, it is assumed that the training set comprises or consists of one or more samples of independent and identically distributed pairs $(x_i, y_i)$. In an embodiment, in order to measure how well a function fits the training data, a loss function L: $Y \times Y \rightarrow \mathbb{R}^{\geq 0}$ is defined. For training sample $(x_i, y_i)$, the loss of predicting the value $\hat{y}$ is $L(y_i, \hat{y})$.

The risk R(g) of function g is defined as the expected loss of g. This can be estimated from the training data as $$R_{emp}(g) = \frac{1}{N}\sum_i L(y_i, g(x_i)).$$

In an embodiment, machine learning models of the patterning process can be trained to predict, for example, contours, patterns, CDs for a mask pattern, and/or contours, CDs, edge placement (e.g., edge placement error), etc. in the resist and/or etched image on a wafer. An objective of the training is to enable accurate prediction of, for example, contours, aerial image intensity slope, and/or CD, etc. of the printed pattern on a wafer. A contour refers to an outline of a pattern to be printed on the substrate or printed pattern on the substrate. For example a contour may be obtained via image processing algorithm such as an edge detection or other custom algorithms. The intended design (e.g., a wafer target layout to be printed on a wafer) is generally defined as a pre-OPC design layout which can be provided in a standardized digital file format such as GDSII or OASIS or other file format.

Figure 22:
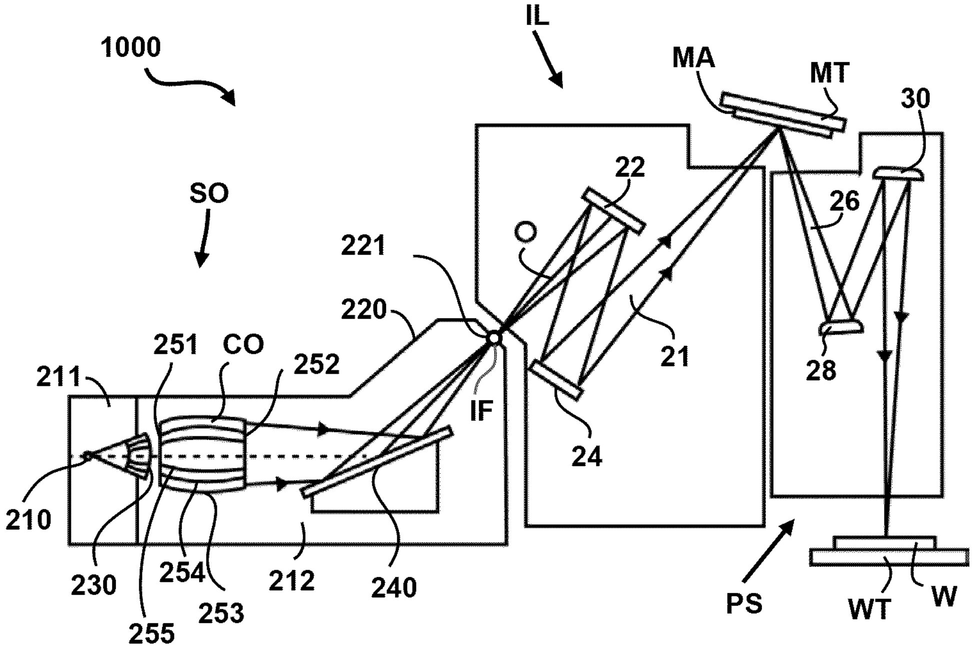
FIG. 22 is a more detailed view of the apparatus in FIG. 21, according to an embodiment.

An exemplary flow chart for modelling and/or simulating parts of a patterning process is illustrated in FIG. 22. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (σ) settings as well as any particular illumination shape (e.g. off-axis radiation shape such as annular, quadrupole, dipole, etc.), where σ (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Figure 2:
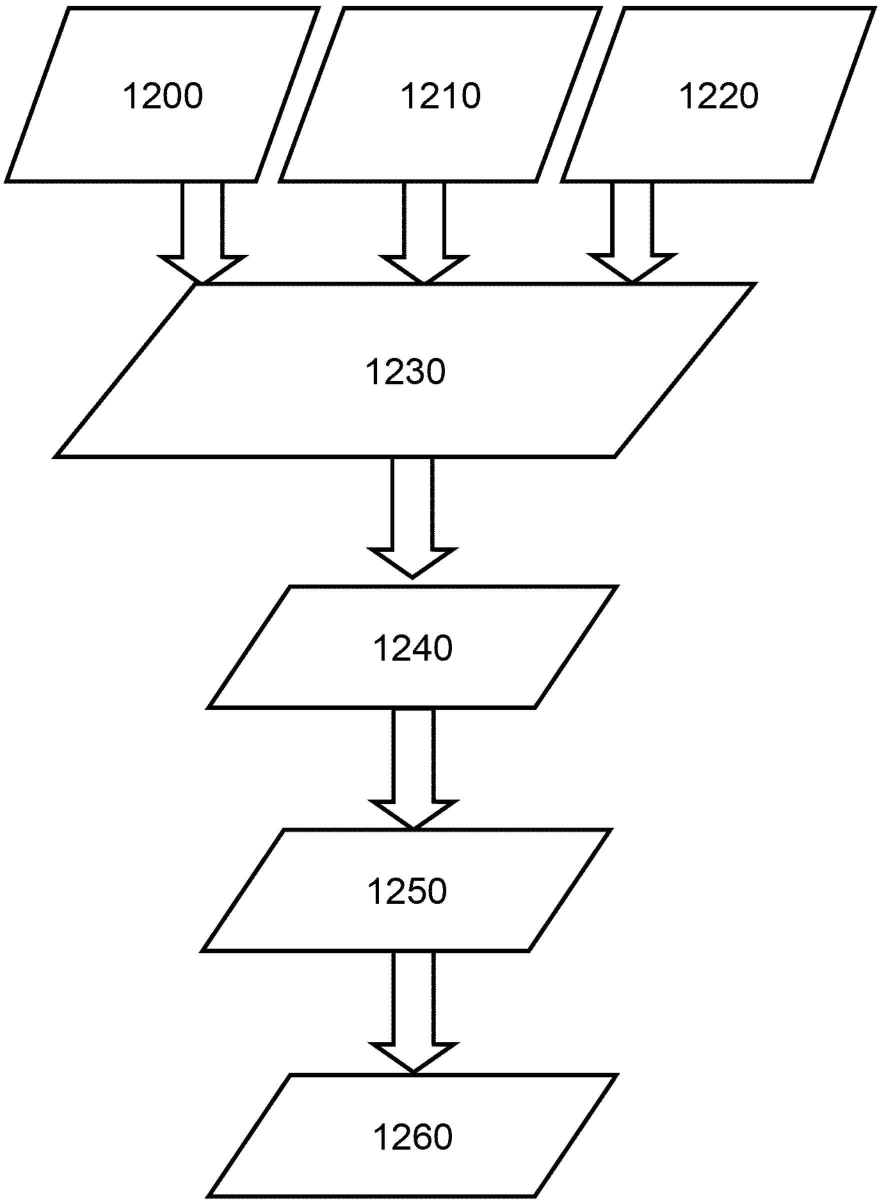
FIG. 2 depicts an example flow chart for modeling and/or simulating at least part of a patterning process, according to an embodiment.

In an example, computational analysis of the lithography or an etch process employs a prediction model (e.g., as discussed above with FIG. 2) that, when properly calibrated, can produce accurate prediction of dimensions output from the lithography and/or the etch process. A model of lithography or etch processes is typically calibrated based on empirical measurements. This calibration include running a test wafer with different process parameters, measuring resulting critical dimensions after etch process, and calibrating the model to the measured results. In practice, fast and accurate models serve to improve device performance or yield, enhance process windows or increase design choices. It can be understood by a person skilled in the art that the methods described herein are not limited to a particular model of the lithography. For calibration of a desired model, images can be obtained after any semiconductor fabrication steps. For example, an aerial image, a resist image, an etch image, an image after a chemical mechanical polishing, or other images related to a process of the patterning process.

In computational lithography models, usually critical dimension (CD) gauges measured by CD-SEM (Scanning Electron Microscope) are used as input data to calibrate the model. A goal of lithography modelling is to predict accurate resist contours for every location on the substrate. However, when aggressive model forms or deep convolution neutral networks are used, the calibration results in models that suffer from overfitting. When such over fitted models are used to predict, e.g., the resist contour, it may deviate from a printed contour on the substrate, especially for those patterns that did not have CD gauges available.

To mitigate this overfitting issue, the present disclosure provides a method to extract metrology gauges such as edge placement (EP) gauges based on CD SEM raw images to provide much better pattern coverages. EP gauges can help cover complicated 2D patterns (e.g., holes). Complex 2D patterns are defined by at least 2 dimensions (e.g., width and length) and it may not easy to place CD cut lines or it may not have a reliable CD metrology recipe. Furthermore, existing metrology tools require a few days extra data processing time, which may be difficult to fit in a tight production time schedule. Even more challenging, sometimes it is very difficult to extract accurate 2D contours from SEM images due to scan direction, shadowing effects and/or charging effects.

As such, there are several limitations to methods of creating computational lithography models with only CD gauges from CD SEM metrology. The limitations originate from the fact that lithography and plasma etch processes are composed of complex physical and chemical reactions, which are so complex that linear terms can model pattern dependent etch biasing only to a certain extent. However, more complicated high order terms or deep convolutional neutral networks are prone to serve overfitting, which fail to predict a physical structure's contour beyond the metrology measured locations. To prevent overfitting with CD SEM metrology data, a method to extend CD metrology data to provide better data coverage and prevent overfitting is needed.

The methods of present disclosure provide ways for generating metrology gauges such as EP gauges based on CD gauges and a model to mitigate model overfitting problem. Further, there is provided a method for modifying a simulated model contour to match, for example, measurement CD data of a printed substrate. Thus, a model calibrated using the metrology gauges of the present disclosure can provide better models that can further provide accurate contour shape information In an embodiment, a method is provided for using CD gauges associated with a printed substrate and EP gauges associated with a model simulation to train an DCNN lithography and/or etch model.

In an embodiment, CD metrology data (e.g., from CD-SEM) and physical models are used to generate modified simulated contour that matches with metrology data. Further, based on modified contours, simulated metrology data (e.g., EP gauges) is generated. The present simulated metrology provides more metrology information compared to CD gauges only, e.g., obtained from CD-SEM.

Figure 3A:
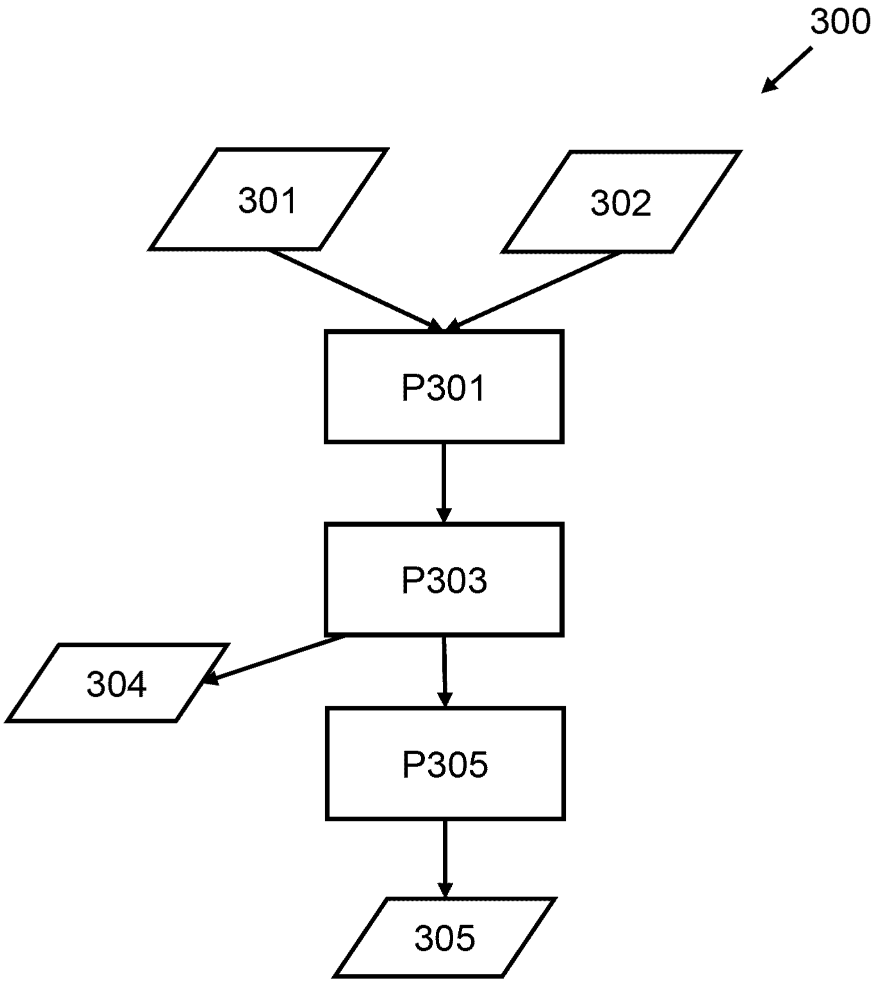
FIG. 3A is a flow chart of a method of generating metrology gauges (e.g., edge placement gauges, CD gauges, etc.) for measuring a physical characteristic of a structure on a substrate, according to an embodiment.
Figure 3B:
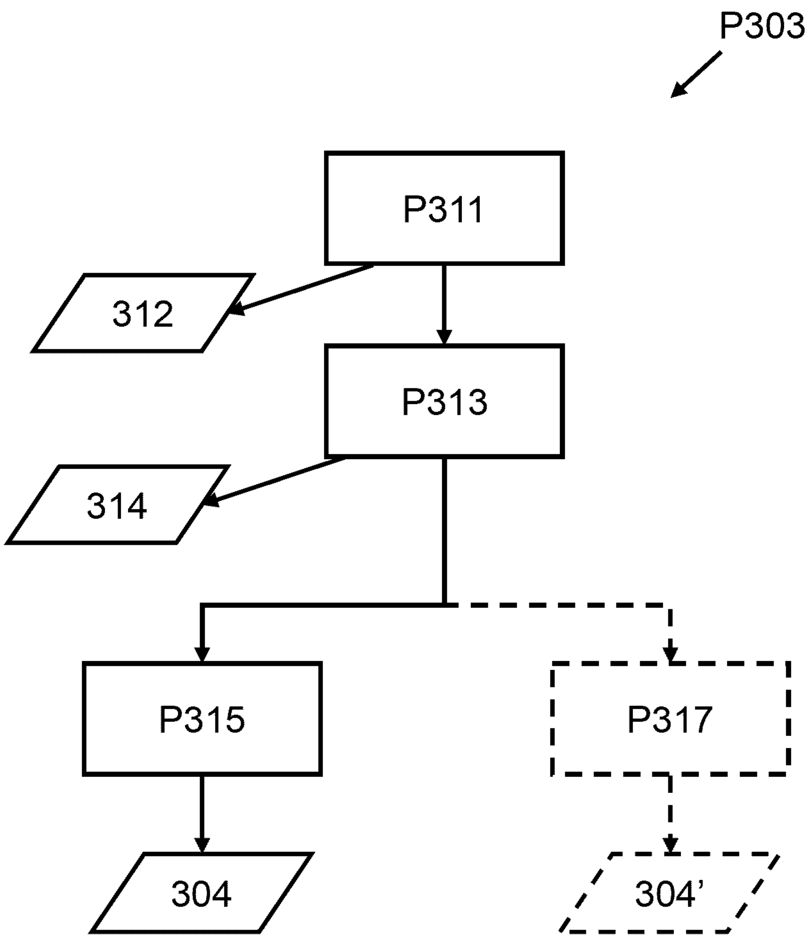
FIG. 3B is a flow chart of an example implementation of steps used in modifying the simulated contour in the method of FIG. 3A, according to an embodiment.

FIG. 3A is a flow chart of a method of generating metrology gauges (e.g., edge placement gauges, CD gauges, etc.) for measuring a physical characteristic of a structure on a substrate. The method 300 generates metrology gauges for use in measuring the physical characteristic of a structure. In an embodiment, the measurements may be performed using a metrology tool. In an embodiment, the metrology gauges may be exported (e.g., in a GDS file format) to a model (e.g., OPC, etch model, resist model, etc.) used for improving the patterning process. Furthermore, in an embodiment, the method 300 may also be used to generate modified simulated contours and export (e.g., in a GDS file format) such modified contours to a model (e.g., etch model) used for improving the patterning process.

In an embodiment, the term "gauge" or "metrology gauge" refers to structures used for measuring dimensions (e.g., a size, shape) associated with a physical characteristic of a structure (e.g., memory pattern, or other circuit patterns) on a substrate. In an embodiment, the gauges may be, for example, a visual mark or visual display of such information. In an embodiment, the gauges (e.g., points at a contour of the structure) used to measure edge placement is referred as edge placement (EP) gauges. Similarly, a gauge used to measure a critical dimension (CD) of a structure may be referred as a CD gauge. The gauge is also associated with a location on the substrate. The location may be a defined location (e.g., a user-defined) or other location of interest such as a location with minimum or maximum dimensions associated with the structure. For example, the location may be associated with a minimum CD value of a line or bar shaped structure. The EP and CD gauges are used as examples to explain the concepts. However, the present disclosure is not limited to gauges used to measure the physical characteristic associated with the structure of a substrate.

Procedure P301 includes obtaining (i) measured data 301 associated with the physical characteristic of the structure printed on the substrate, and (ii) at least portion 302 of a simulated contour of the structure, the portion of the simulated contour being associated with the measured data 301. In an embodiment, the portion of the simulated contour is part of the simulated contour within a defined region around the measured data 301 associated with the structure. In an embodiment, the portion can be the whole simulated contour.

In an embodiment, the obtaining of the portion 302 of the simulated contour includes defining, around a defined location associated with the measured data 301, a region of the substrate; and simulating, within the defined region of the substrate, a patterning process to obtain the portion 302 of the simulated contour of the structure. For example, a defined location can be a field of view (FOV) of a metrology tool or a user selected area around the portion 302 of the structure. In an embodiment, the FOV is a limited region on the substrate captured for observation or measurement purposes. For example, FOV is a region around the structure printed on the substrate, a location at which CD value of the structure is measured, or other given location. In an embodiment, the defined location (i.e., a local area) size can be chosen such that within the area the contour shape has best physical fidelity. When two CD gauges are very close to each other, the areas can be chosen so that they do not overlap with each other.

In an embodiment, the measured data 301 is obtained via a metrology tool. In an embodiment, the metrology tool is a scanning electron microscope (SEM) and the measured data 301 is obtained from a SEM image. In an embodiment, the SEM tool captures an image of the structure printed on the substrate. The image may be acquired at a given location using a FOV.

The simulated contour is an outline of the structure to be printed on the substrate. In an embodiment, the simulated contour is obtained via patterning process simulation (e.g., FIG. 2). In an embodiment, the simulation process may be configured to execute the process model (e.g., of FIG. 2) with respect to a particular location only instead of simulating an entire substrate. Simulating only a portion of the substrate allows faster execution and reduces the computational resources compared to simulating an entire substrate.

Figure 4A:
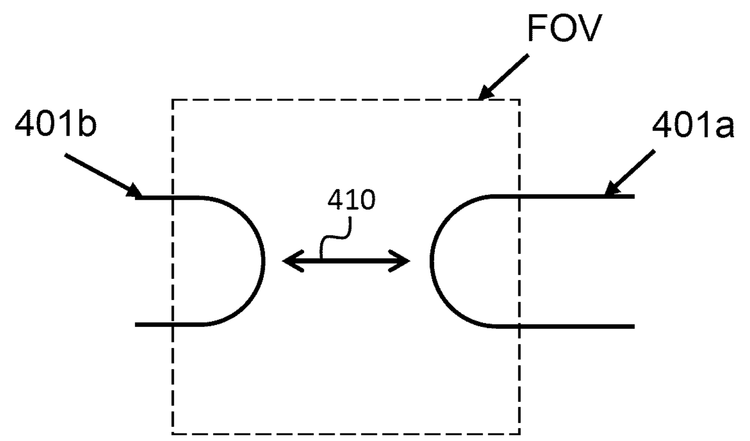
FIG. 4A illustrates an example of simulated contour and measured data at a location (e.g., within FOV of a SEM tool), according to an embodiment.
Figure 4B:
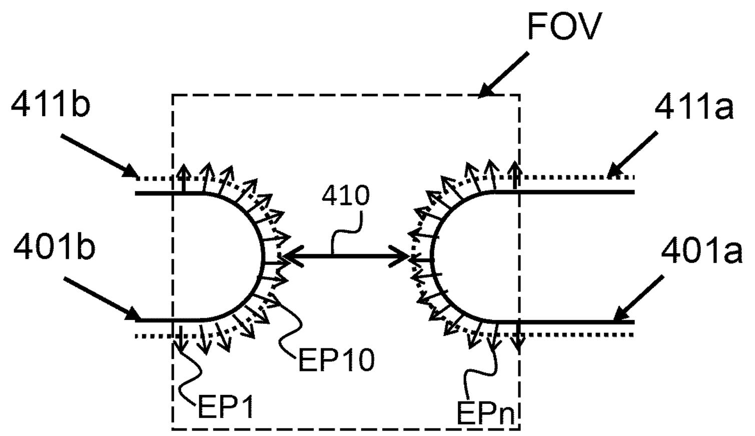
FIG. 4B shows an example of modified contour associated with the simulated contour of FIG. 4A, according to an embodiment.

FIG. 4A shows an example of simulated contour 401*a* and 401*b* (collectively referred as 401) and measured data 410 at a location (e.g., within FOV of a SEM tool). In an embodiment, the simulated contour 401 is obtained via simulating the patterning process by executing the one or more process model (e.g., in FIG. 2). In an embodiment, the measured data 410 is a physical characteristic (e.g., CD, EPE, etc.) associated with the structure. The value associated with the physical characteristic may be obtained from simulated contour 401 as well. However, the simulated values of the physical characteristic may be substantially different from the actual measured values of the physical characteristic. Hence, if measurements are based on such simulated contour the measurements will eventually be inaccurate and may affect the yield of the patterning process. The present disclosure provides a way to modify the simulated contour and further generate the metrology gauges (e.g., EP gauges, CD gauges) based on the modified contour. For example, procedure P303 is one way (by example) to modify the simulated contour. FIG. 4B illustrates an example of a modified contour (e.g., 411*a* and 411*b*) of the simulated contour 401.

In an embodiment, the measured data 410 is the CD value associated with the structure at the given location on the substrate. In an embodiment, the CD value is a distance between two contours at the given location. In an embodiment, the measured CD values is substantially different from the CD value obtained from the simulated contour 401. In an embodiment, the simulated contour 401 is modified such that the measured CD value and the simulated CD value are similar.

Procedure P303 includes modifying, based on the measured data 301, the portion 302 of the simulated contour of the structure, thereby generating a modified contour 304 of the simulated contour. An example implementation of steps used in modifying the simulated contour is discussed with respect to FIG. 3B.

Procedure P311 includes determining, based on the portion 302 of the simulated contour, simulated data 312 associated with the physical characteristic of the simulated contour of the structure. Procedure P313 includes determining a difference between the measured data 301 and the simulated data 312 associated with the physical characteristic of the structure. Procedure P315 includes modifying, based on the difference 314, the portion 302 of the simulated contour such that the difference 314 between the measured data 301 and the simulated data 312 is reduced. The modified contour 304 thus generated can be further used in various applications (e.g., improving patterns, determining process parameters, OPC etc.) related to the patterning process.

As mentioned earlier, the measured data is a CD value at the defined location associated with the structure. Then, the modifying of the portion 302 of the simulated contour is based on the difference 314 between simulated CD value and the measured CD value associated with the structure.

FIG. 4B shows an example of modified contour 411 associated with the simulated contour 401 and the measured data 410 at the given location (e.g., within FOV of a SEM tool). The modified contour 411 can be obtained using procedures P311, P312 and P315 (or P317) as discussed herein. For example, the simulated contour 401 may be modified based on measured data 410 such as CD value. In an embodiment, the simulated contour is used to measure a CD value at the same location as the measured data. For example, the simulated CD may be measured between the simulated contour 401*a* and 401*b*. Then, a difference between the simulated CD value and the measure CD value is computed. Based on the CD difference, the simulated contour is modified within the FOV such that the CD difference is minimized. In an embodiment, the difference is such that a size of the simulated contour is increased to the modified contour 411*a* and 411*b* so that the CD difference is reduced (in an embodiment, minimized). Further, based on the modified contour 411, metrology gauges are generated. The generated metrology gauges such as EP gauges can be further used to accurately measure a characteristic of the structure on the substrate.

In another example, the modifying of the portion 302 of the simulated contour includes adjusting a threshold value (e.g., used in a level-set method to obtain a simulated contour) related to obtaining the simulated contour. For example, in an embodiment, procedure P311, P313, and P315 may be employed. Procedure P311 includes determining, based on the portion 302 of the simulated contour, simulated data 312 associated with the physical characteristic of the simulated contour of the structure. Procedure P313 includes determining a difference 314 between the measured data and the simulated data 312 associated with the physical characteristic of the structure. Procedure P317 includes adjusting, based on the difference 314, a threshold value employed to generate the simulated contour such that the difference 314 between the measured data 301 and the simulated data 312 is reduced, wherein the adjusted threshold modifies the portion 302 of the simulated contour. The modified contour 304' is thus generated and can be further used in different applications (e.g., OPC) related to the patterning process, as mentioned earlier.

In an embodiment, the measured data is CD of a feature. In this case, in an example, the modifying of the portion 302 of the simulated contour includes determining, using the portion 302 of the simulated contour, a simulated CD value at the defined location on the substrate where a measured CD value is obtained; determining a difference 314 between the simulated CD value and the measured CD value; and adjusting, based on the difference 314, the threshold value such that the difference 314 between the CD values is reduced, the adjusted threshold value modifying the portion 302 of the simulated contour.

Figure 5:
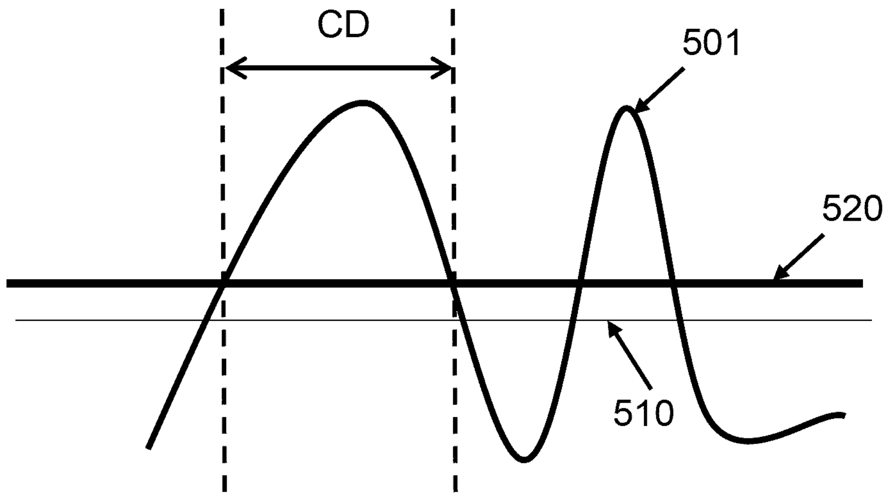
FIG. 5 shows an example of signal associated with a simulated contour and threshold value used to generate the modified contour, according to an embodiment.

FIG. 5 shows an example of signal 501 associated with a simulated contour and threshold value used to generate the modified contour. A signal can be imagined as a mountain-like profile in 3 dimensions (e.g., x, y, and z). For example, a patterning process simulation may involve a level-set method that receives signal 501 e.g., image intensity associated with a simulated pattern. Furthermore, the level-set method employs a threshold value 510, e.g., in form of a plane that cuts across the signal. Then, the intersection of the plane with the signal generates the simulated contour. Depending on the threshold value a different simulated contour may be generated. Hence, according to the present disclosure, a difference between the measured data and simulated data from the simulated contour can be used to adjust the threshold value 510 to a different threshold value 520. The adjusted threshold value 520 is such that it generates the simulated contour that is such that the difference between the simulated data and the measured data associated with the physical characteristic is reduced or minimized. For example, the threshold value 510 may be modified in related to the difference between the simulated data and the measured data.

Procedure P305 includes generating the metrology gauges (e.g., edge placement gauges) on or adjacent to the modified portion of the simulated contour, the metrology gauges being placed to measure the physical characteristic of the simulated contour of the structure. In an embodiment, the generating the metrology gauges includes specifying marks such as points on (or close to) the modified portion of the simulated contour; and exporting the location of the points as the metrology gauges (e.g., the edge placement gauges). In an embodiment, the locations may be exported or outputted as text file, GDS file or other format used for processing by a computer. FIG. 4B illustrates example edge placement gauges EP1, . . . EP10, . . . , EPn generated along the modified contour 411. In an embodiment, the edge placement gauges are points at or around the modified contours. In an embodiment, the edge placement gauges may be generated by drawing lines from the simulated contour to the modified contour in perpendicular direction to the modified contour.

In an embodiment, the method 300 can be modified to generate a modified contour from a simulated contour, the modified contour being used for improving the patterning process. In an embodiment, the improving of the patterning process includes determining, based on a patterning process simulation (e.g., see FIG. 2), parameters of the patterning process.

In an embodiment, the method 300 may be modified as follows. The method includes, as explained in the procedure P301, obtaining (i) measured data 301 associated with the physical characteristic of the structure printed on the substrate, and (ii) at least portion 302 of a simulated contour of the structure, the portion 302 of the simulated contour being associated with the measured data. Further, as explained with respect to the procedure P303, the method includes generating, based on the measured data 301, a modified contour of the portion 302 of the simulated contour of the structure. In an embodiment, the modified contour may be generated by shifting the simulated contour based on a difference 314 between the measured data 301 and a simulated data 312 (discussed with respect to P303). In an embodiment, the simulated contour is shifted to reduce, for example, a CD difference between the measured CD and the simulated CD value at a given location.

Further, the method includes providing the modified contour to a model of the patterning process to determine parameters of the patterning process. For example, the modified contour can be provided to an etch model or resist model of FIG. 2 to further improve the accuracy of a simulated etch contour or a simulated resist contour.

Figure 6:
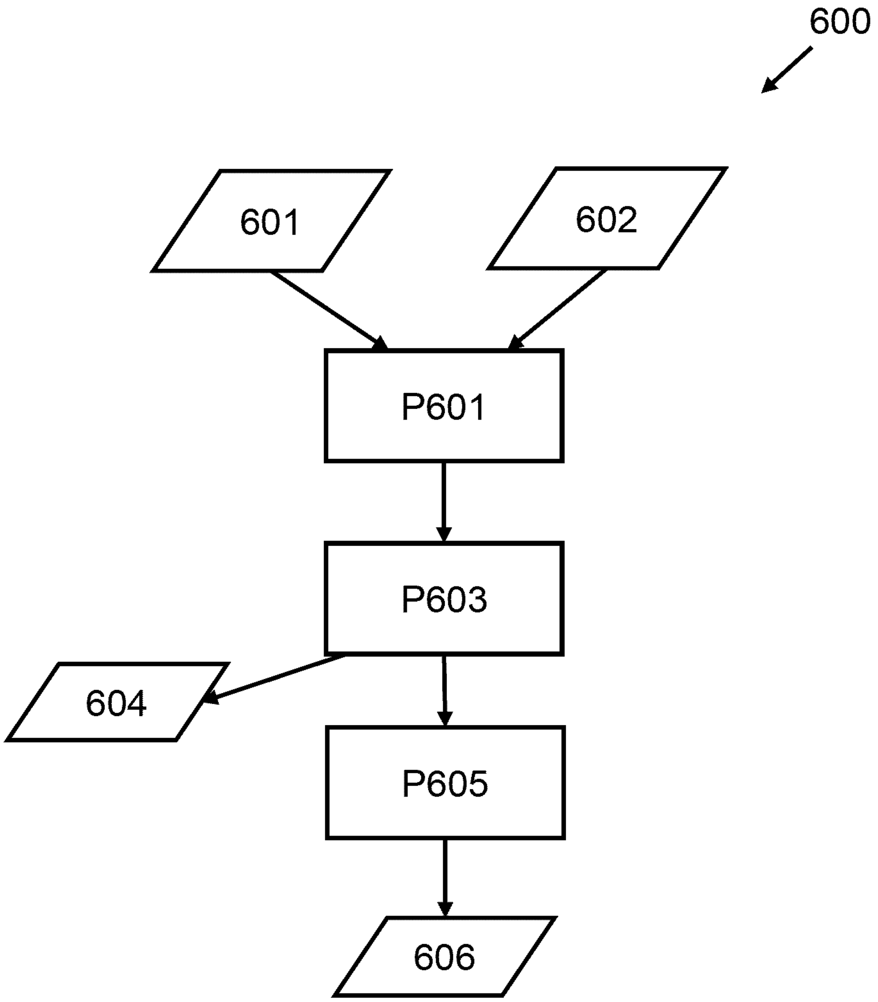
FIG. 6 is a flow chart of a method for determining hotspot locations associated with a substrate, according to an embodiment.

FIG. 6 is a flow chart of a method 600 for determining hotspot locations on a substrate. The method 600 may be an application of the metrology gauges such as EP gauges or CD gauges. For example, the EP gauges generated by P305 may be used to determine hotspot locations. The hotspot detection algorithm may use the EP gauges (e.g., EP1, . . . , EPn) to determine the patterns and locations of the hotspots. In an embodiment, hotspots are process window limiting patterns or pattern that are most likely to fail after imaging on the substrate. An example method of determining hotspots is explained with procedures P601, P603 and P605. However, the metrology gauges may be used in any other hotspot detection algorithm which is configured to determine hotspots based on metrology gauges and simulated contours.

Procedure P601 includes obtaining (i) a simulated contour 601 associated with one or more patterns, the simulated contour 601 being associated with measured data of a physical characteristic of the one or more patterns printed on the substrate, and (ii) metrology gauges 602 (e.g., edge placement and/or CD gauges) associated with the simulated contour 601.

In an embodiment, the obtaining of the metrology gauges 602 includes determining, via simulating a patterning process using the measured data, the simulated contour 601 associated with the one or more patterns; modifying at least a portion of the simulated contour 601 based on the measured data associated with the one or more patterns; and generating the metrology gauges 602 on or at the modified portion of the simulated contour 601. For example, the method 300 may be employed to modify the simulated contour 601 and further generate the metrology gauges 602 such as EP gauges.

Procedure P603 includes determining, based on the metrology gauges 602, values 604 of the physical characteristic associated with the one or more patterns. In an embodiment, the determining values 604 of the physical characteristic includes measuring, at one or more of the metrology gauges 602, values 604 of the physical characteristic. In an embodiment, the metrology gauges 602 can be used to measure an edge placement error (EPE) of a simulated contour with respect to a reference pattern (e.g., target pattern), CD gauge, or other physical characteristics.

Procedure P605 includes determining, based on the physical characteristic values 604, hotspots 606 or hotspot locations 606 on the substrate, wherein a hotspot or a hotspot location refers to a pattern or a location on the substrate where a physical characteristic value is less than a hotspot threshold value associated with the one or more patterns.

In an embodiment, the determining of the hotspot locations 606 includes determining whether a value of the physical characteristic associated with the one or more patterns breaches the hotspot threshold value; and responsive to breaching of the threshold value, identifying the location of the metrology gauges 602 associated with breaching of the threshold value. For example, the hot spot threshold value can be minimum CD or EPE value of a feature to be printed on the substrate.

Figure 7:
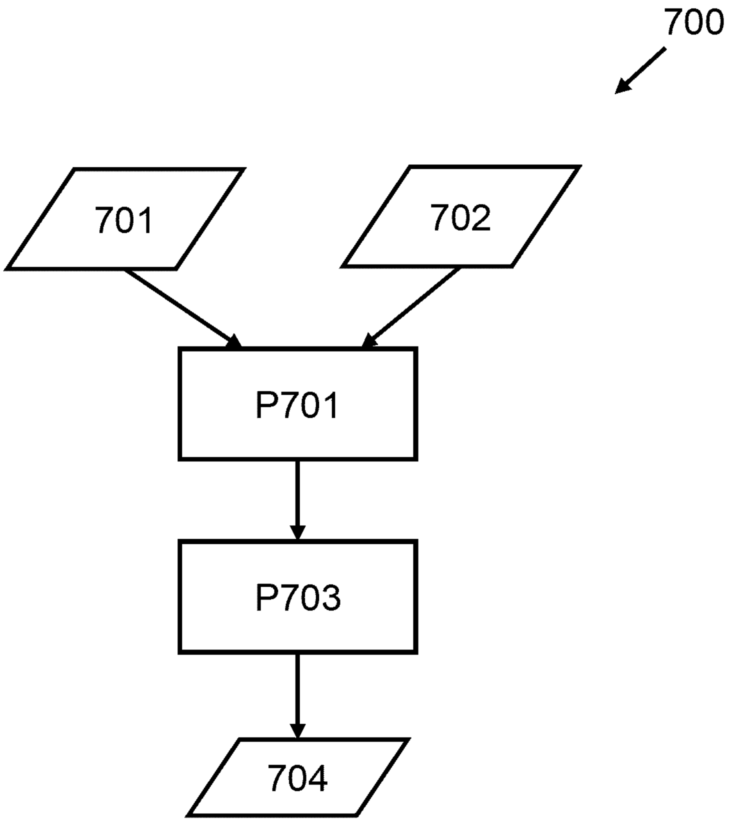
FIG. 7 is a flow chart of a method for training a model associated with a patterning process, according to an embodiment.

FIG. 7 is a flow chart of method 700 for training a model associated with a patterning process. The method 700 is an example application of the metrology gauges 702 that were generated using the method 300 herein. As the metrology gauges 702 are more accurate, a process model related to the patterning process trained based on the metrology gauges 702 will be provide more accurate results (e.g., closely matching the measured data). The results of the model can be further used to determine improved parameters of the patterning process thereby resulting in a higher yield from the actual patterning process. Example procedures involved in the method 700 are discussed in detail below.

Procedure P701 includes obtaining (i) measured data 701 associated with the physical characteristic of the structure printed on the substrate, and (ii) metrology gauges 702 (e.g., EP gauges or CD gauges) associated with a simulated contour of a structure to be printed on a substrate, the simulated contour being associated with a defined location on the substrate where the physical characteristic is measured.

Procedure P703 includes training, using the measured data 701 and the metrology gauges 702, the model 704 such that a performance metric of the patterning process is improved around the defined location on the substrate, the performance metric being a function of the metrology gauges 702 and the physical characteristic. After completion of the training process the model is referred as the trained model 704

In an embodiment, the training of the model is an iterative process. An iteration includes determining, via executing the model, a simulated contour of the structure to be printed on the substrate and simulated data associated with the physical characteristic of the simulated contour of the structure; determining a first difference between the simulated data and the measured data 701, and a second difference between points along the simulated contour and the metrology gauges 702; and determining, based on a gradient of the performance metric with parameters of the patterning process, model parameters such that the performance metric is minimized, the performance metric being a function of the first difference and the second difference.

Figure 8:
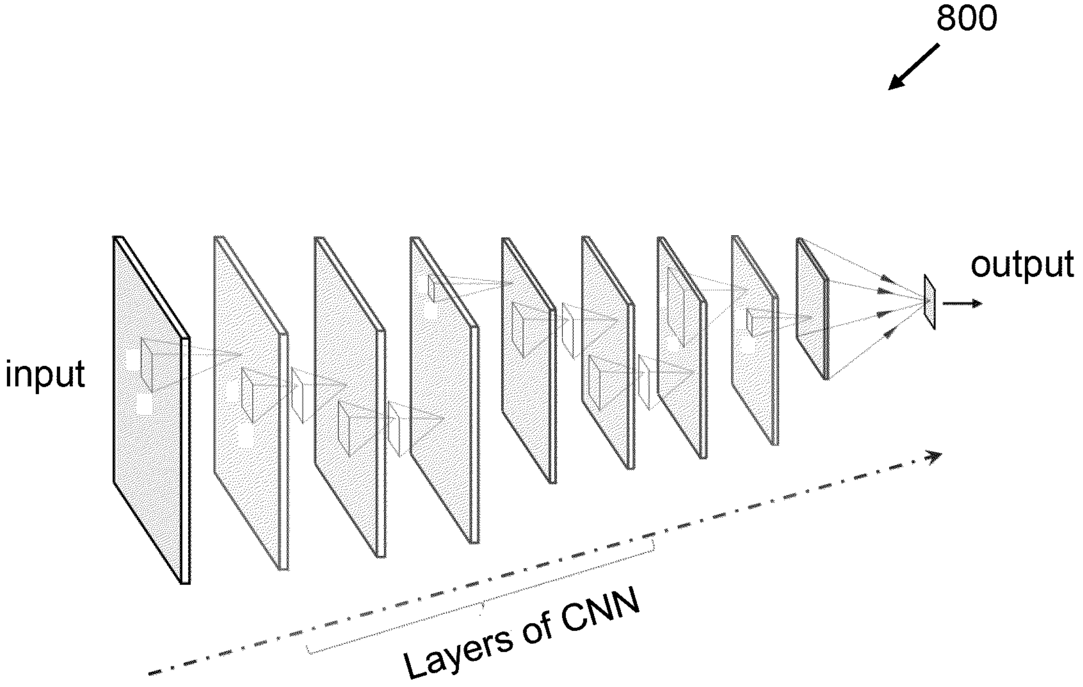
FIG. 8 illustrates an example model such as a convolutional neural network (CNN) comprising multiple layers, each layer being associated with a model parameter such as weight and bias, according to an embodiment.

FIG. 8 illustrates an example model such as a convolutional neural network (CNN) comprising multiple layers, each layer being associated with a model parameter such as weight and bias. When an input (e.g., feature vector) is passed through such layers the input is weighted and biased according to the assigned values for each layer and generate an output (e.g., an output vector of the simulated contour and patterning process parameters).

As mentioned earlier, the training of the machine learning model such as CNN 800 is an iterative process. An iteration includes initializing the model parameters of the CNN 800; predicting the values of the physical characteristic associated with the substrate; and adjusting model parameter values of the CNN 800 such that a cost function is reduced.

In an embodiment, the adjusting of the model parameter values is based on a gradient decent of the cost function. In an embodiment, the cost function is minimized. In an embodiment, the adjusting of the model parameter values of the CNN 800 includes determining a gradient map of the first cost function as a function of a model parameter. Then, based on the gradient map, the model parameter values are determined such that the cost function are minimized.

In an embodiment, the adjusting of the model parameter values comprises adjusting values of: one or more weights of a layer of the convolutional neural network, one or more bias of a layer of the convolutional neural network, hyper-parameters of the CNN and/or a number of layers of the CNN. In an embodiment, the number of layers is a hyper-parameter of the CNN which may be pre-selected and may not be changed during the training process. In an embodiment, a series of training process may be performed where the number of layers may be modified.

In an embodiment, the cost function is the difference between measured data and the simulated data (e.g., predicted by the CNN 800). The difference is reduced by modifying the values of the CNN model parameters (e.g., weights, bias, stride, etc.). In embodiment, a gradient corresponding to the difference may be dcost/dparameter, where the cnn_parameters values may be updated based on an equation (e.g., parameter=parameter−learning_rate*gradient). In an embodiment, the parameter may be the weight and/or bias, and learning_rate may be a hyper-parameter used to tune the training process and may be selected by a user or a computer to improve convergence (e.g., faster convergence) of the training process.

In an embodiment, the model is at least one of the process model such as an etch model configured to predict an etch image; or a resist model configured to predict a resist image.

Computational analysis of an etch process employs a calibrated prediction model that can predict dimensions of etched structures resulting from the etch process. As mentioned herein, a model related to the etch process may be calibrated based on empirical measurements. The calibration process includes patterning a test wafer with different process parameters, measuring critical dimensions (CDs) of a pattern on the test wafer after the etch process, and calibrating the model based on the measured CDs. In practice, a fast and accurate model can be employed to improve a performance of a patterning apparatus, a patterning yield, process windows of the patterning process, or increase design choices related to e.g., determining mask patterns.

After the etch process, an etch contour of an etch pattern deviate from corresponding a resist contour of a resist pattern on the substrate. The deviation is pattern dependent. A constant bias may not be applied to the resist contour to generate the etch contour. In etch modeling, the resist contour may be used as an input, and the goal is to predict etch bias values to be applied to different points on the resist contour. In an existing modeling approach, a pattern-dependent etch bias values are modelled by a linear equation, which uses a number of linear terms describing pattern characteristics.

There are several limitation related to modeling pattern-dependent bias values using the linear equation. The limitations originate from the fact that etch processes (e.g., using dry etch) comprise complex chemical reactions and physical particle bombardments, which are so complex that linear terms can model the pattern-dependent etch bias values only to a limited extent. As such, etch effects that cannot be accurately modeled by linear terms should be considered to develop more accurate etch models. In an embodiment, the etch model can be further used in various application related to lithography. For example, the etch model can be employed to determine e.g., OPC related to a mask pattern in order to improve a patterning performance or yield.

Figure 10A:
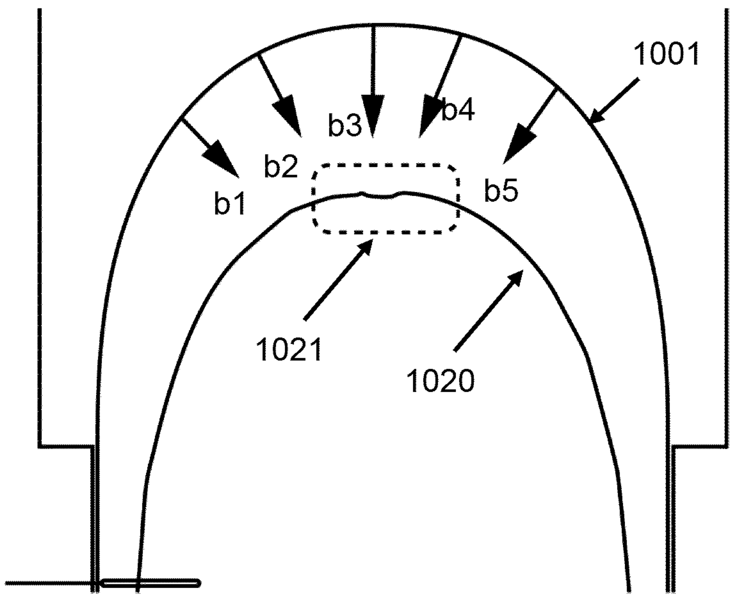
FIGS. 10A-10C are examples of etch biasing a resist contour and issues arising due to the etch biasing, according to an embodiment.
Figure 10B:
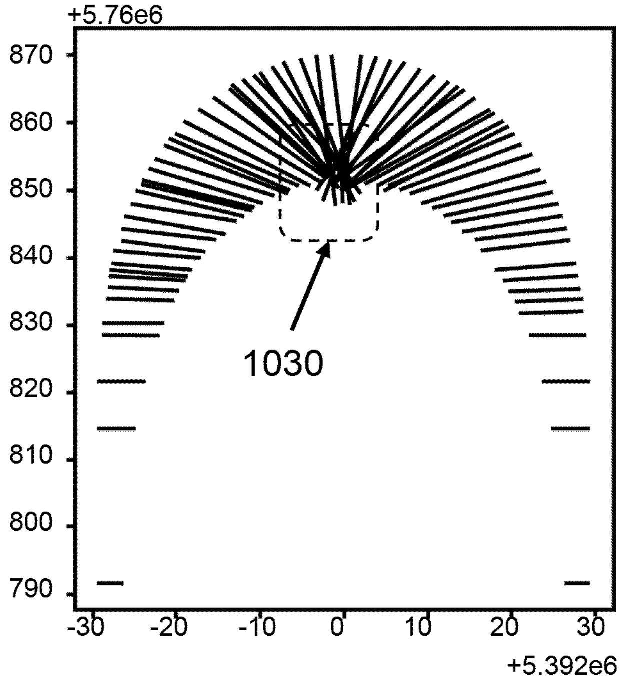
Figure 10C:
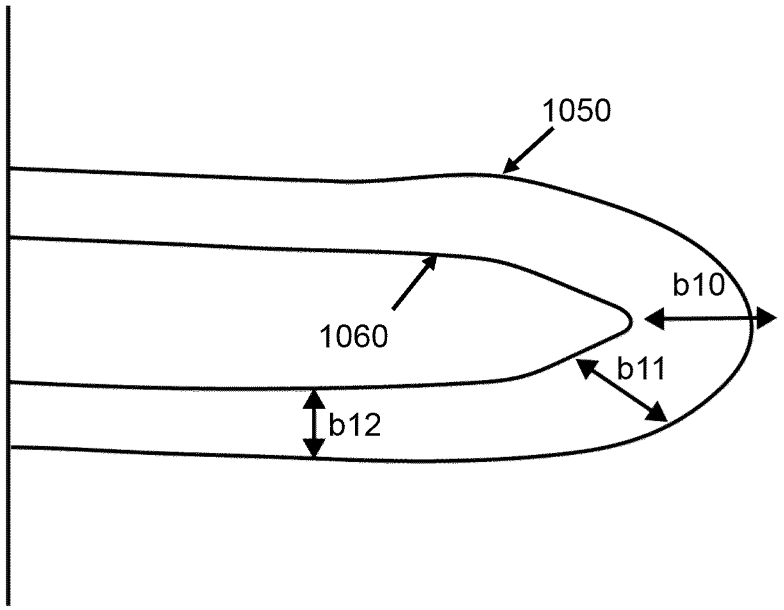

Currently, an etch contour is generated by applying bias values (e.g., determined by the etch model) at different points of the resist contour. The bias values are applied in local normal directions to the resist contour. However, this approach tends to result in overcalculation of bias values at high curvature points, and the resulting etch contour may exhibit non-physical behaviors (e.g., fish-mouth like shape or non-reasonably sharp ends as shown in FIG. 10A-10C). The present disclosure describes a method to determine etch contours and bias directions to solve aforementioned issues related to the etch contours.

Figure 9:
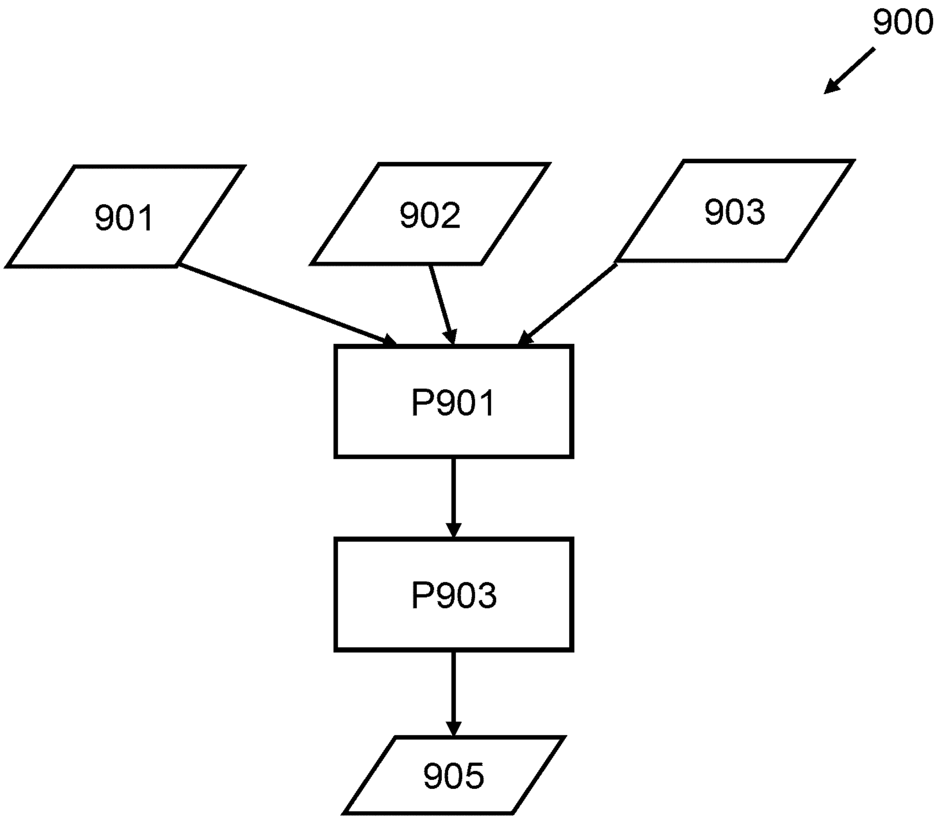
FIG. 9 is a flow chart of a method for training a model associated with a patterning process, according to an embodiment.

FIG. 9 is an exemplary process 900 for training a machine learning model associated with a patterning process in accordance with an embodiment of the present disclosure. The training is based on measured data related to an after development image (ADI) and an after etch image (AEI). After training, the trained model can determine bias values that can be applied the ADI contours to generate an etch contour. Exemplary process 900 includes different procedures discussed in detail below.

Procedure P901 includes obtaining (i) contour data 901 of an after development image (ADI) pattern on a substrate, (ii) measured data 902 of an after etch image (AEI) pattern printed on the substrate, and (iii) reference bias values 903 based on the contour data 901 of the ADI pattern and the measured data 902 of the AEI pattern. For example, the reference bias values 903 are determined based on a difference between measurements of the ADI pattern and the AEI pattern.

In an embodiment, the contour data 901 can be represented in the form of images of contours associated with one or more features in the ADI pattern. In an embodiment, the images are generated from simulated contours of a simulated ADI pattern. In an embodiment, the obtaining of the contour data 901 involves executing, using a design pattern to be printed on the substrate as input, one or more process model associated with the patterning process to generate the simulated ADI pattern. The patterning process comprising a resist process or a resist model to simulate the resist process. From the simulated ADI pattern, ADI contours can be extracted. Each contour being a contour of a feature within the simulated ADI pattern. In an embodiment, the one or more process models comprise at least one of: an optics model configured to determine an aerial image, and a resist model configured to determine a resist image. An example simulation process employing different models related to the patterning process is discussed with respect to FIG. 2.

In an embodiment, the images may be obtained from a metrology apparatus (e.g., SEM) configured to capture an image of the substrate after a resist process on the substrate. In an example, the contour can be a resist contour that can be extracted from a resist image e.g., a SEM image of the resist pattern printed on the substrate.

In an embodiment, the measured data 902 is obtained at specified metrology gauges. As mentioned earlier, the metrology gauges can be edge placement gauges, critical dimension (CD) gauges associated with the AEI pattern, or both. For example, the measured data 902 at the metrology gauges include locations of the edge placement gauges associated with a contour of the AEI pattern printed on the substrate; and/or CD values associated with the AEI pattern printed on the substrate.

In an embodiment, when the metrology gauges are CD gauges, the reference bias values 903 are obtained via a calibration process configured to determine bias values associated with a given CD gauge. A bias value is indicative of an amount of CD reduction to be applied to the ADI pattern to generate the AEI pattern. In an embodiment, the bias values are provided at ends of the given CD gauge. The bias values may not be equal at the two ends. In other words, the bias values may be asymmetric with respect to a center of the CD gauge.

In an embodiment, the calibration process comprises determining a bias model as a linear combination of a number of terms charactering a pattern. The bias model can determine a bias value at one specific resist contour point. An example bias model is given by following linear model.

$$\text{bias} = \sum_i c_i \text{Term\_bias}_i + \text{const\_bias}$$

In the above equation, $\text{Term\_bias}_i$ is a model term associated with a point i of the ADI contour, and $c_i$ is a coefficient associated with a Term_bias at point i. In an embodiment, the model terms can be a linear expression, or a physical term (e.g., CD, dose, focus, MSD, resist thickness) related to an aspect of the patterning process. In an embodiment, the bias model can be implemented in conjunction with lithographic simulation process (e.g., FIG. 2). In an embodiment, resist contours are then biased in the normal direction using the model-predicted bias values to obtain corresponding etch contours.

In an embodiment, the terms in the bias model may be expressed in CD and the point i refers to a first end or a second end of a CD gauge (e.g., a horizontal line, or a vertical line drawn across a contour to measure CD of the contour). Accordingly, in an embodiment, the bias model can determine bias values at the ends of the CD gauge. When working with CD gauges, bias values are partitioned into two ends of a CD gauge since the bias is not always symmetrical relative to a gauge center. A method of partitioning the bias for CD gauges uses the calibrated bias model above, which can generate asymmetric bias values at a given CD gauge. In an embodiment, a gauge center is used as reference, and the bias value is partitioned equally into two CD gauge ends. The partitioned CD bias values are then used to train a CNN model. In an embodiment, when edge placement (EP) gauges is used, there is no asymmetric partitioning of bias values. The bias values are determined for each EP gauge and such bias values can be directly used to train the CNN model.

In an embodiment, the ADI pattern or ADI contours extracted therefrom may be first transformed into a different image format before using them to train a model. For example, the image format may include a Filtered Downsample Resist Image (FDRI). For example, the FDRI can be a low pass filter image generated by applying a low pass filter to the contours extracted from ADI pattern. In an embodiment, contours can be a binary image, which if directly used for training the model, the training process may be very slow compared to using the FDRI. Additionally, FDRI is a grey scale image that provides more flexibility in modifying each pixel values during the training process so that a model output converges to a desired result at a faster rate. In an embodiment, the images may be generated by transforming the ADI contours in terms of the bias model terms or other mathematical transform of the ADI contours. The transformation may cause a better correlation of the bias model terms with an etch process.

Procedure P903 includes training, using the measured data 902 and the contour data 901 as training data, the machine learning model to determine bias values to be applied to an ADI contour. After the training process, a trained model 905 is generated. The trained model 905 can be further applied to one or more aspects of the patterning process to improve e.g., the lithographic performance, patterning yield, adjusting parameters of the patterning process, etc.

In an embodiment, the training of the model comprises adjusting model parameters of the machine learning model to cause the bias values to be in a specified range that is determined based on the reference bias values 903. For example, values of weights and biases of a model (e.g., a convolutional neural network (CNN)) may be adjusted to cause the model to generate bias values to be within the specified range. In an embodiment, the specified range indicates that the model generated bias values converges to the reference bias values 903. For example, the specified range may be defined as (e.g., a reference bias value ±0.1 nm) at a given location of ADI pattern. In an embodiment, the specified range may be defined as values deviating within 0-5% of each reference bias values.

In an embodiment, the training of the machine learning model is an iterative process. An iteration includes (a) executing, using the measured data 902, the contour data 901, and given values of the model parameters, the machine learning model to generate the bias map associated with the contour data 901, the bias map comprising the bias values; (b) adjusting, based on a gradient of a difference between the model-based bias values and the reference bias values 903, the model parameters of the machine learning model such that the difference is reduced; and (c) performing steps (a)-b) until the difference is minimized.

In an embodiment, the model parameters are weights and biases of the model. Adjusting the weights and biases of one or more layers of the model causes the model to generate bias values that are proximately same as the reference bias values 903. In an embodiment, the gradient of the difference, between the model-generated bias values and the reference bias values 903, guides adjusting of the values of the model parameters. For example, the gradient can be a map of a derivative of the difference with respect to the model parameters. The map comprises peaks and valleys, where valleys indicate points of minimizations. In an embodiment, the training process comprises adjusting the values of the model parameters so that the difference is minimized Such minimization can be associated with a valleys of the gradient map. For example, the minimization is reached by changing the model parameter values in a direction of valley's trough.

In an embodiment, the machine learning model is configured to generate a representation of a bias map for the ADI contour. In an embodiment, the bias map can be represented as a pixelated image, each pixel indicative of a bias value. Further, the pixel location can be related to a target layout's coordinates, or the ADI pattern's coordinates. In an embodiment, the bias values can be positive, negative or zero. A positive bias value indicates the ADI contour should be reduced and a negative bias value may indicate the ADI contour should be increased, or vice versa.

In an embodiment, the bias map, generated via a trained machine learning model, comprises etch bias values to be applied to a resist contour to determine an etch contour that will be printed on the substrate. In an embodiment, the bias map includes coordinates associated with an entire wafer or a die. Each coordinate associated with a bias value. In an embodiment, the etch bias values are applied in local normal directions to the resist contour. The local normal direction is a direction that is normal the resist contour at a given point on resist contour. Thus, each point on the resist counter will have a different normal direction. In an embodiment, the bias map is a pixelated image, each pixel having intensity value indicative of a bias value.

In an embodiment, as mentioned earlier, applying the bias values to the ADI contour in local normal directions may cause non-realistic etch contours. FIG. 10A-10C illustrates examples of existing biasing approach and related issues.

In FIG. 10A, bias values b1, b2, b3, b4, and b5 may be applied at different location of a resist contour 1001. The bias values b1-b5 are applied in a normal direction to generate an etch contour 1020. In case the bias values b1-b5 are large enough, these may cause a fish-mouth like irregular shape 1021 in the etch contour 1020. Such fish-mouth shape 1021 is an unrealistic representation of the etch pattern.

As shown in FIG. 10B, the bias values intersect at a curvature area 1030. Such intersection of biases causes the fish-mouth 1021. In an embodiment, the large bias values that may not intersect can cause sharp-line-ends (e.g., as shown in FIG. 10C). FIG. 10C shows a resist contour 1050 to which bias values b10, b11, and b12 can be applied to generate an etch contour 1060. The bias values b10 and b11 are large enough to cause a knife-point like sharp-line end. Hence, moving an ADI contour in local normal directions by bias values computed by a calibrated bias model may not yield an accurate AEI contour. As such, there is provided a method in FIG. 11 to determine a bias vector that can be applied to e.g., a resist contour.

Figure 11:
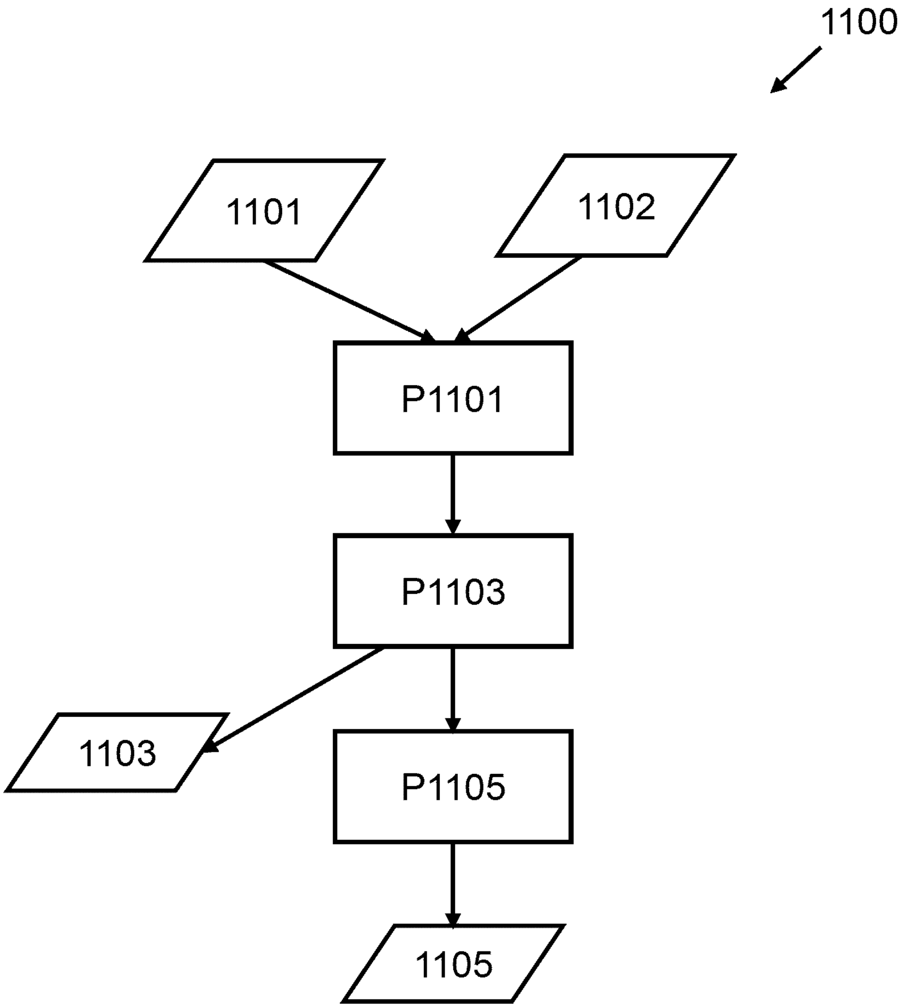
FIG. 11 is a flow chart of a method for determining a bias vector associated with an after development image (ADI) pattern

FIG. 11 is an exemplary process 1100 for determining a bias vector associated with an after development image (ADI) pattern according to an embodiment of the present disclosure. In an embodiment, the bias vector includes a bias direction that points the bias values in a direction that does not cause intersection of a contour curvature when biased. In an embodiment, the method 1100 includes following procedures discussed in detail below. In an embodiment, the bias values may be obtained from a trained model (e.g., 905) configured to generated bias values for any given pattern, the bias vector of the method 1100, user-defined bias values, or other bias determining algorithms or methods.

Procedure P1101 includes obtaining (i) a probability distribution function 1101 (PDF) of particle deposition within the ADI pattern on a substrate, and (ii) a contour function 1102 characterizing an ADI contour associated with the ADI pattern.

In an embodiment, the PDF 1101 of particle deposition is determined or calibrated based on measured substrate data. The measured substrate data may include deposition data of particles, and measured etch pattern. In an embodiment, the PDF 1101 of the particles characterizes a net deposition effect or a net etch effect of the particles contacting the ADI contour. Herein, embodiments described in detail by using the terms of "deposition" or "deposition rate" where the resultant contour is derived by applying bias inward from the original contour. However, it will be appreciated that the disclosed mechanism of determining the bias directions can also be extended to applications where a resultant contour can be derived by applying bias outward from the original contour and by using negative deposition rate. In an embodiment, the PDF 1101 can be a Gaussian distribution. However, this is merely exemplary; any other suitable form of functions can be used without departing from the scope of the present disclosure. In an embodiment, the obtaining of the PDF 1101 includes determining a variance or standard deviation (a) of the Gaussian distribution that fits the measured data. An example of how the variance of the Gaussian distribution affects the bias direction and the etch contour is discussed with respect to FIG. 13 and FIGS. 14A-14B later in the present disclosure.

Procedure P1103 includes determining, based on a combination of the PDF 1101 of the particles and the contour function 1102 over an area of the ADI contour, a deposition rate 1103 of the particles at a specified location on the ADI contour. In an embodiment, the deposition rate 1103 can be positive (e.g., corresponding to shrinkage of contour) or negative (e.g., corresponding to expansion of contour). In an embodiment, the determining of the deposition rate 1103 of the particles includes convoluting the contour function 1102 with the PDF 1101 of the particles, and integrating over the area of the ADI contour.

Figure 12:
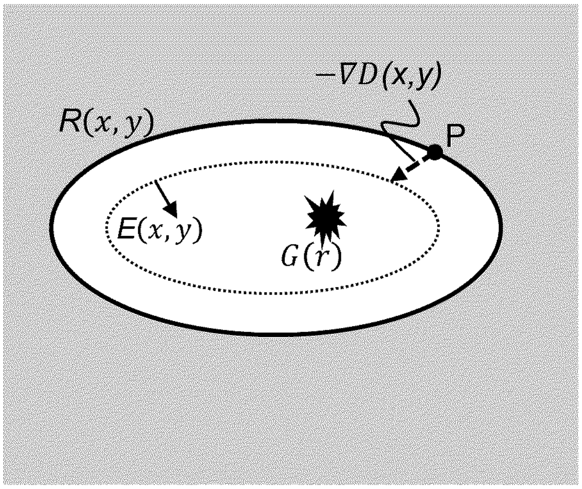
FIG. 12 is an illustrate of particle in a resist trench, according to an embodiment.

FIG. 12 illustrates an example effect of a particle on a resist contour represented by a contour function R(x,y). As shown, at a point P on the resist contour, a bias direction points to a particle location (marked by star). In an embodiment, the particle location is characterized by a concentration of the particles. In an embodiment, the particles will deposit on a resist wall, accordingly the resist contour will reduce towards the direction of the particles. In an embodiment, a resist trench will include etch particles whose spread is characterized by e.g., Gaussian distribution G(r). In an embodiment, the resist contour R(x,y) is integrated with all the particles over the area of the resist contour to find a final etch counter E(x,y). In other words, the etch contour is not decided by just one particle, but all the particles in the resist trench.

In an embodiment, the deposition rate 1103 e.g., D(x, y) can be determined based on following equation:

$$D(x, y) = k\int\int R(u, v)G(x-u, y-v)dudv$$

Figure 14A:
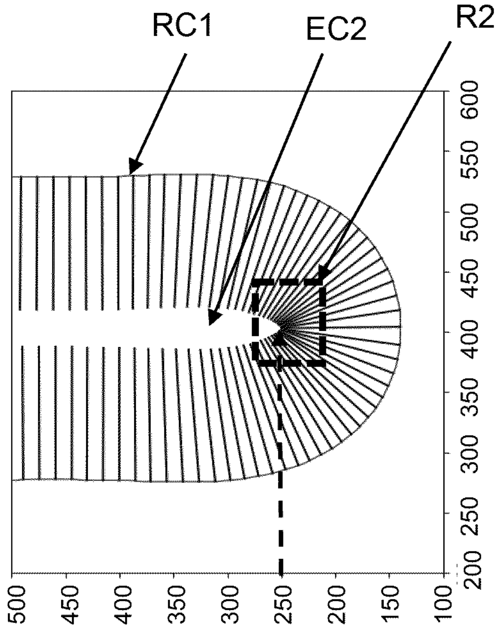
FIGS. 14A and 14B are an example biasing in a direction determined in FIG. 11, according to an embodiment.
Figure 14B:
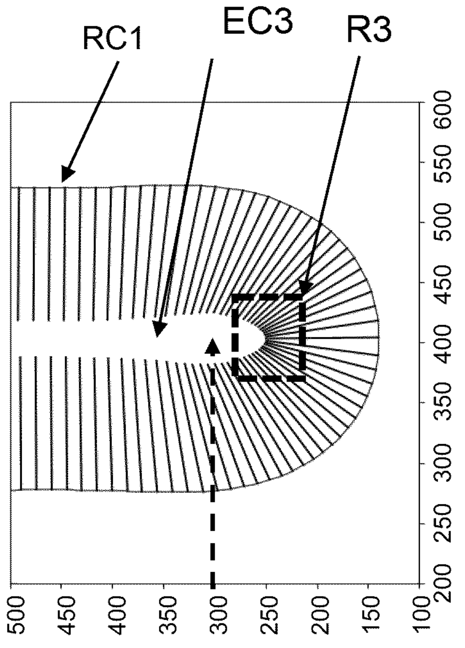

In an the above equation, R(u, v) is a contour function to characterize a geometric shape of a contour in ADI (e.g., a resist contour); and G (x−u, y−v) is a deposition rate function for particles within a trench at a distance r to a resist wall. In an embodiment, the deposition rate function is a Gaussian function characterized by a mean and a variance. In an embodiment, the variance of the Gaussian function may be determined based on measurement data (e.g., etch contour on a printed substrate). In an embodiment, G (x−u, y−v) acts as a guide to a direction of the bias value. For example, FIGS. 14A and 14B illustrate show changing a variance of the Gaussian function affect a bias direction and a final etch contour.

Procedure P1105 includes determining, based on the deposition rate 1103, a bias vector 1105 associated with the ADI pattern. The bias vector 1105 when applied to the ADI contour of the ADI pattern generates an after etch image (AEI) contour. In an embodiment, the bias vector 1105 includes a bias direction at a particular location of the ADI contour. In an embodiment, the method may further includes a step of applying a bias value along the bias direction to generate the AEI contour. For example, the bias vector includes a bias direction along which a bias value may be applied at a particular location on a resist contour, as discussed herein (e.g., see FIGS. 14-14B).

In an embodiment, the determining of the bias vector 1105 includes determining a gradient of the deposition rate 1103 with respect to a first direction and a second direction of the ADI pattern. For example, the first direction (e.g., along x-axis) and the second direction (e.g., along y-axis) are perpendicular to each other.

In an embodiment, for the deposition rate D (x, y) above, the gradient of the deposition rate 1103 is determined based on following equation:

$$\nabla D = \frac{\partial D}{\partial x}\vec{x} + \frac{\partial D}{\partial y}\vec{y}$$

In the above equation, the gradient ∇D of the deposition rate is expressed as a combination of an x-component and a y-component of the deposition rate in a given direction.

In an embodiment, the bias direction at each specified locations on the ADI contour is associated with a bias value. When the bias values at different locations are applied to the ADI contour, the bias vector 1105 at different locations do not intersect each other. In an embodiment, the bias direction of the bias vector 1105 includes a direction that is not normal to the ADI contour. In an embodiment, the variance of the Gaussian distribution of the particle causes the bias vector 1105 to change. As such, in an embodiment, the variance may be adjusted to generate the bias vector 1105 that does not cause intersection of ADI contours when bias values are applied.

In an embodiment, when the ADI pattern includes a plurality of contours, a set of bias vector 1105 are determined for each ADI contour individually. For example, the ADI pattern may include feature on a first layer and a second layer on top of the first layer. In one example, one feature may be surrounded by neighboring features of the ADI pattern. In an example, a density or closeness of neighboring feature may be incorporated to calculate the bias values. However, regardless of the density of the neighboring features, the bias vector does not cause intersection of ADI contours after applying the bias values.

Figure 13:
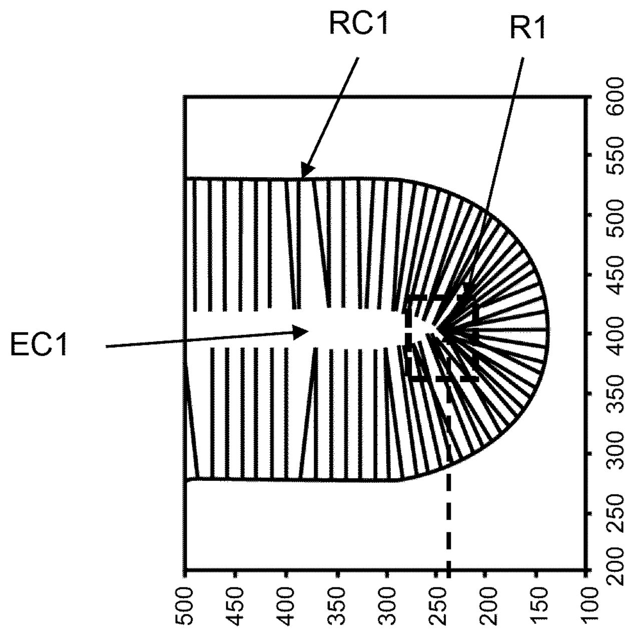
FIG. 13 is an example biasing in a normal direction, according to an embodiment.

FIG. 13 illustrates an example of applying bias values to a resist contour RC1 in normal directions at different points on the resist contour to generate a biased contour EC1 (also referred as an etch contour EC1). Note, at a curvature of the resist contour RC1, the bias vectors intersect each other in the region R1. As mentioned earlier, such intersection causes irregular or non-physical behavior of the etch contour EC1. For example, moving the resist contour RC1 by the bias values to cause the biased contour EC1 to have fish-mouth or sharp-line-ends in the region R1.

In an embodiment, the biased contour EC1 can be analogous to the contour generated by applying the method 1100, discussed above. For example, the biased contour EC1 can be generated by setting a variance of the Gaussian function to approximately zero. The effect of change in the variance of the Gaussian function is further illustrated in FIGS. 14A and 14B.

FIGS. 14A and 14B are example results of applying method 1100 using the Gaussian function with variance of e.g., 30 and 60, respectively. In an embodiment, the method 1100 determines a bias vector based on the Gaussian function having the first variance and another bias vector based on the Gaussian function having the second variance relatively higher than the first variance. When the bias vectors are applied to the resist contour RC1, it does not cause intersection of the bias values and generates biased contours EC2 and EC3.

As the variance of the Gaussian function increases, an intersection point of bias values (related to the resist contour) moves towards left. For example, the intersection point in region R3 is relatively left of the intersection point in region R2. In an embodiment, the intersection point is indicative of relatively higher concentration of particles within a resist trench. Hence, the bias values point towards the intersection point.

Comparing the biased contours EC2 and EC3 shows that contour portions within R2 and R3 do not have sharp edges or fish-mouth like shape. Further, the portion (within R2) of the biased contour EC2 is relatively sharper (pointy) compared to the portion (within R3) of the biased contour EC3.

In an embodiment, the variance value of the Gaussian function may be calibrated based on measured data (e.g., etch contour data of a printed substrate), as discussed earlier. Using the calibrated Gaussian function, a bias direction can be determined using the method 1100. For example, the gradient VD is determined. Further, using the bias values determined e.g., using the trained model 905 (e.g., CNN), and the bias direction ∇D at each point of a resist contour, the etch contour can be generated.

In an embodiment, the methods 900 and 1100 can be employed for various applications related the patterning process. Example applications include, but not limited, to SMO, OPC, hot spot detection, defect detection, adjusting a parameter of a lithographic apparatus during manufacturing process, adjusting parameters of a post-lithographic process, and other related applications.

In OPC application, for example, a mask pattern may be used to generate a resist contour. Using the resist contour as input to the trained model 905, the bias values can be determined. The bias values can be applied to the resist contour to determine an etch contours. In an embodiment, the bias values may be applied in a normal direction or a bias direction determined by the method 1100. Furthermore, depending on a difference between the etch contour and a target contour to be printed on a substrate, optical proximity corrections can be determined to the mask pattern. In an embodiment, the aforementioned steps may be repeated until the difference between the etch contour and the target contour is minimized.

In an embodiment, the method 1100 is not limited to a patterning process. The method 1100 can be extended to determine biased contours for other applications. In example, modification of the method 1100 is discussed as follows.

Figure 15:
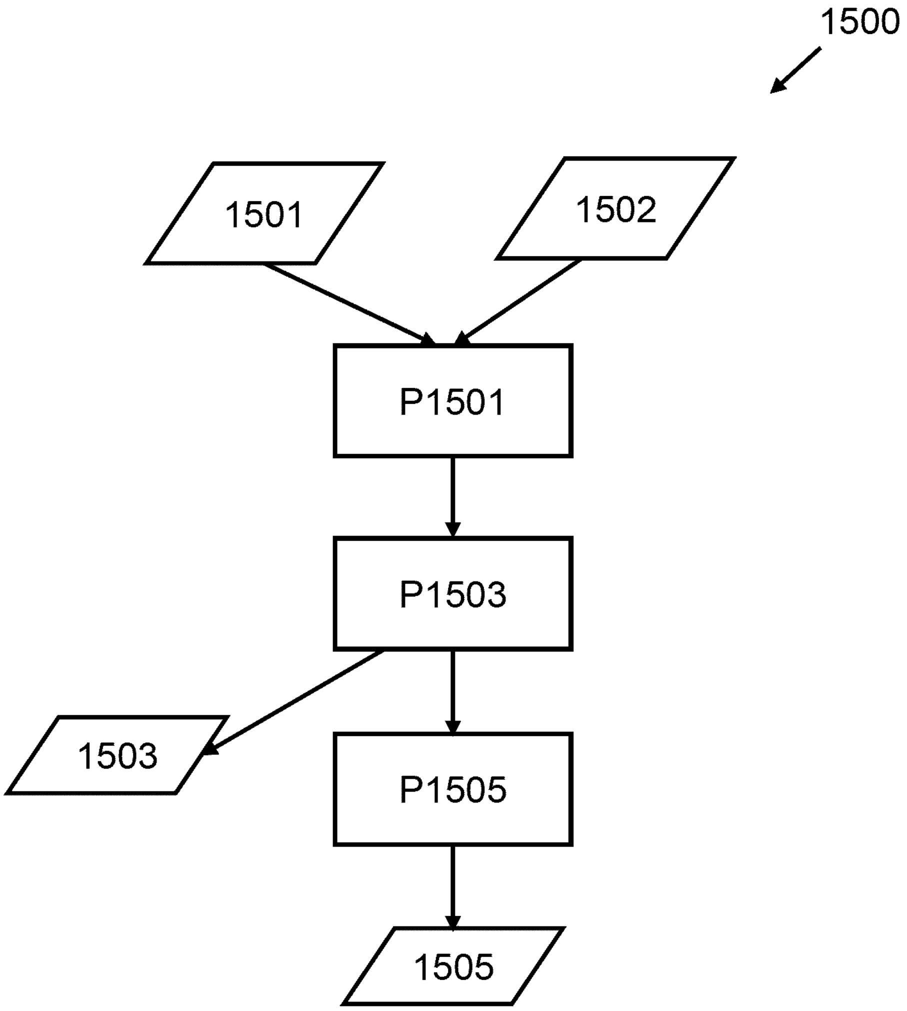
FIG. 15 is a flow chart of a method for determining a bias vector associated with a process, according to an embodiment.

In an embodiment, FIG. 15 is a flow chart of an exemplary process 1500 for determining a bias vector for a contour. The method 1500 includes following procedures.

Procedure P1501 includes obtaining (i) a probability distribution function 1501 (PDF) corresponding to a process to be performed on the contour, and (ii) a contour function 1502 characterizing a shape of the contour. For example, the PDF 1501 can represent a behavior of a machining process via a machining tool, a measurement process via a metrology tool, a lithography related process as discussed herein, guiding a robotic device along a contour, or other process involving contour based operations. In an example, the contour can be a geometric shape related to a component to be machined. In another example, the contour can characterize limits of a tool travel path during machining process, a tool travel path during a measurement process, a robot movement path, or other properties related to contours. In an embodiment, the PDF 1501 can represent a property of the tool used in the process. For example, the PDF 1501 can specified for a particular tool having a specified dimension used during the machining operation, etching, robotic component dimension, or other properties affecting the contour when the process is performed on the contour.

Procedure P1503 includes convoluting the contour function 1502 with the PDF 1501 over an area of the contour to determine a process rate 1503 at a specified location on the contour. In an embodiment, the process causes an addition or a removal of material in which the contour is formed, the addition or the removal causing a change in shape of the contour. In an embodiment, the process rate characterizes a behavior of the addition or the removal of the material in which the contour is formed. For example, the addition or removal of material during a machining process, or addition or removal of material during an etch process related to lithography. The PDF 1501 of the process can be a Gaussian function fitted based on measured data related to the process performed on the contour.

Procedure P1505 includes determining, based on the process rate 1503, a bias vector 1505 to be applied to the contour for generating a biased contour that is indicative of an effect of the process applied on the contour. For example, the bias vector 1505 includes bias values applied inward or outward with respect to the contour to generate the biased profile. For example, in a removal process, the bias values may be applied in an inward direction. In an addition process, the bias values may be applied in an outward direction. The processes discussed herein e.g., machining, etching, robotic movement, etc. are exemplary to explain the concepts and does not limit the scope of the present invention.

Figure 16A:
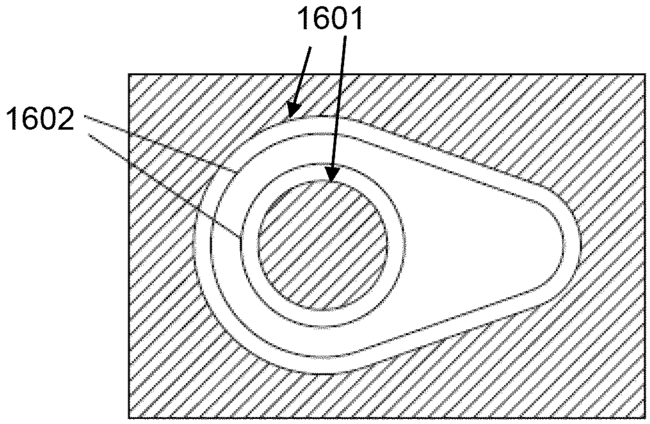
FIGS. 16A and 16B illustrate example applications of biased contours, according to an embodiment.
Figure 16B:
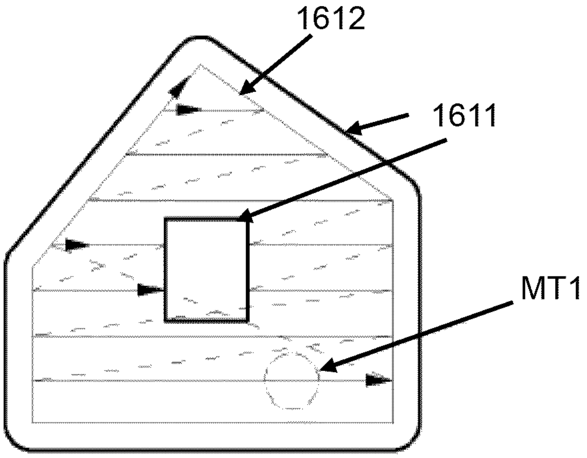

FIGS. 16A and 16B illustrate examples of contour based processes. For example, FIG. 16A illustrates a machining operation performed on a die via a machining tool (e.g., a milling tool). The component includes a contour 1601 before the machining process is performed. After machining, a machined contour 1602 is obtained. Such machined contour 1602 represents a biased contour determined via a PDF characterizing the machining process using a tool of specified dimensions.

FIG. 16B illustrates another example of contour based process. For example, a contour 1611 represents an initial contour of a component to be machined (or scanned) via a tool MT1. After machining, the biased contour 1612 is obtained. In an embodiment, based on the contour 1611 and the biased contour 1612, a tool path (represented by horizontal and dotted lines inside the biased contour 1612) can be determined. As shown, the tool MT1 is circular with a specified radius and machining speed used to generate or trace the biased contour 1612. It can be understood that the present disclosure is not limited to a particular tool. The tool using in the process can be a machining tool, an etching tool, a scanning tool, or other tools related to lithography process used to generate or trace the biased contour.

In an embodiment, one or more procedures of methods 300, 600, 700, 900, 1100, and 1500 can be implemented on one or more processors of a computer system. In an embodiment, there is provided a computer program product comprising a non-transitory computer readable medium having instructions recorded thereon, the instructions when executed by a computer implementing performs one or more procedures of the above methods.

For example, In an embodiment, a non-transitory computer-readable media comprising instructions that, when executed by one or more processors, cause operations including obtain (i) a probability distribution function (PDF) corresponding to particles deposited within an after development image (ADI) pattern on a substrate, and (ii) a contour function characterizing an ADI contour associated with the ADI pattern; determine, based on a combination of the PDF of the particles and the contour function over an area of the ADI contour, a deposition rate of the particles at a specified location on the ADI contour; and determine, based on the deposition rate, a bias vector associated with the ADI pattern, the bias vector when applied to the ADI contour of the ADI pattern generates an after etch image (AEI) contour.

In an embodiment, the non-transitory computer-readable media in which the obtaining of the probability distribution function (PDF) of particles is based on measured substrate data, the measured substrate data comprising deposition data of particles, and measured etch pattern. In an embodiment, the obtaining of the PDF comprises determining a variance of a Gaussian distribution that fits the measured data.

In an embodiment, the non-transitory computer-readable media in which the determining of the deposition rate of the particles comprise instruction to convolute the PDF of the particles and the contour function; and integrating over the area of the ADI contour, the non-transitory computer-readable media in which the determining of the bias vector comprises determining a gradient of the deposition rate with respect to a first direction and a second direction of the ADI pattern, the first direction and the second direction being perpendicular to each other.

In an embodiment, the non-transitory computer-readable media in which the bias vector comprises: a bias direction at a location of the ADI contour, and further comprising applying a bias value along to generate the AEI contour. In an embodiment, the non-transitory computer-readable media in which the bias direction is determined such that when the bias values at different location are applied to the ADI contour, the bias vector at different locations do not intersect each other. In an embodiment, the non-transitory computer-readable media in which the bias direction comprises: a direction that is not normal to the ADI contour.

In an embodiment, the non-transitory computer-readable media in which the PDF of the particle represents a deposition or an etching process of the particles on the ADI contour, and wherein the deposition rate is positive or negative. In an embodiment, the non-transitory computer-readable media in which the bias values are obtained from a trained machine learning model configured to generated a bias map for a given resist pattern. In an embodiment, the non-transitory computer-readable media in which when the ADI pattern includes a plurality of contours, a set of bias vector are determined for each ADI contour individually.

In an embodiment, there is provided a non-transitory computer-readable media comprising instructions that, when executed by one or more processors, cause operations including obtain (i) a probability distribution function (PDF) corresponding to a process to be performed on a contour, and (ii) a contour function characterizing a shape of the contour; convolute the contour function with the PDF over an area of the contour to determine a process rate at a specified location on the contour; and determine, based on the process rate, a bias vector to be applied to the contour for generating a biased contour that is indicative of an effect of the process applied on the contour.

In an embodiment, the non-transitory computer-readable media in which the process causes an addition or a removal of material in which the contour is formed, the addition or the removal causing a change in shape of the contour. In an embodiment, the non-transitory computer-readable media in which the process rate characterizes a behavior of the addition or the removal of the material in which the contour is formed.

In an embodiment, the trained machine learning model can be employed for various applications related to the patterning process to improve the yield of the patterning process. For example, the method 300 further includes predicting, via the trained machine learning model, substrate images for the design layout; determining, via OPC simulation using the design layout and the predicted substrate images, a mask layout to be used for manufacturing the mask for a patterning process. In an embodiment, the OPC simulation includes determining, via simulating a patterning process model using geometric shapes of the design layout and the corrections associated with the plurality of segments, a simulated pattern that will be printed on a substrate; and determining optical proximity corrections to the design layout such that a difference between the simulated pattern and the design layout is reduced. In an embodiment, the determining optical proximity corrections is an iterative process. An iteration includes adjusting the shapes and/or sizes of the geometric shapes of primary features of the design layout and/or the one or more assist features such that a performance metric of the patterning process is reduced. In an embodiment, the one or more assist features are extracted from the predicted post-OPC image of the machine learning model.

Figure 17:
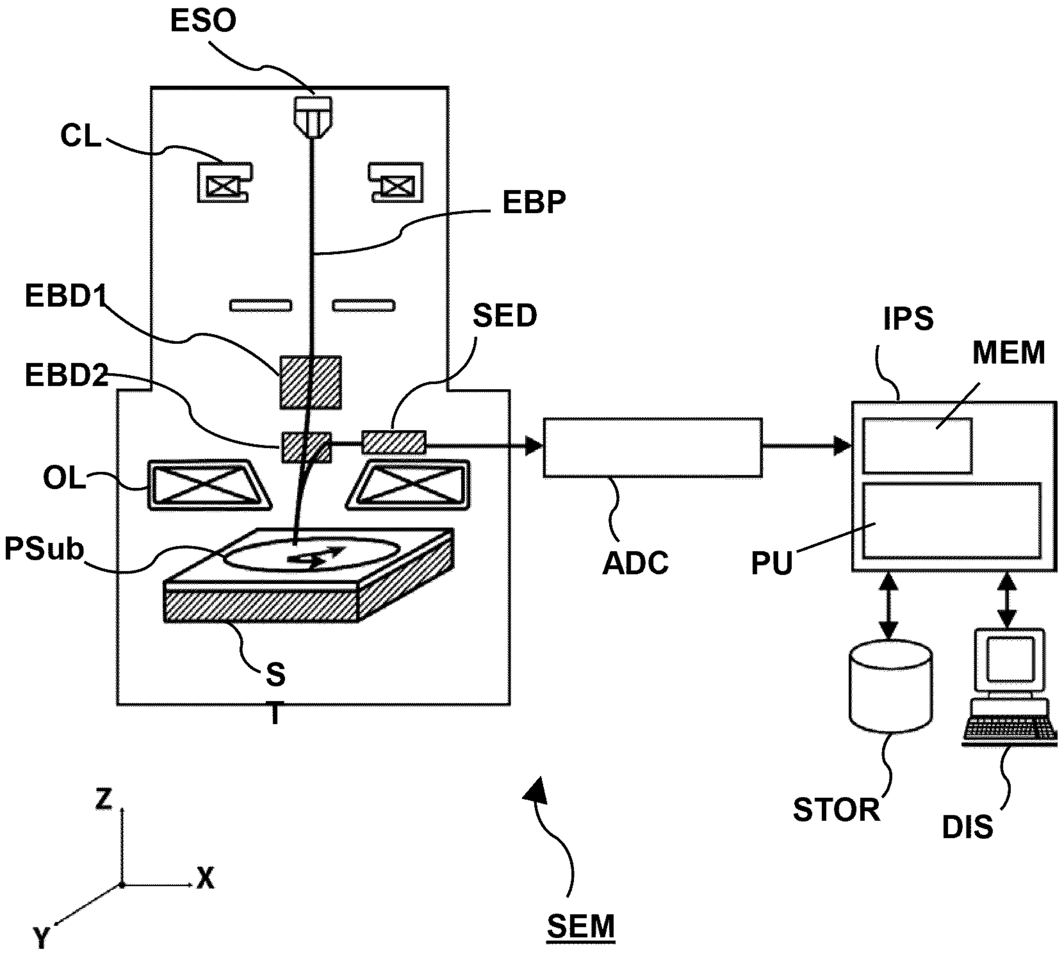
FIG. 17 schematically depicts an embodiment of a scanning electron microscope (SEM), according to an embodiment.

In some embodiments, the inspection apparatus may be a scanning electron microscope (SEM) that yields an image of a structure (e.g., some or all the structure of a device) exposed or transferred on the substrate. FIG. 17 depicts an embodiment of a SEM tool. A primary electron beam EBP emitted from an electron source ESO is converged by condenser lens CL and then passes through a beam deflector EBD1, an E×B deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the E×B deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operations of the equipment with the help of a graphical user interface.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other pattering processes, the structure may be a device or a portion thereof that is being manufactured and the images may be SEM images of the structure. In some instances, the structure may be a feature of semiconductor device, e.g., integrated circuit. In this case, the structure may be referred as a pattern or a desired pattern that comprises a plurality of feature of the semiconductor device. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

Figure 18:
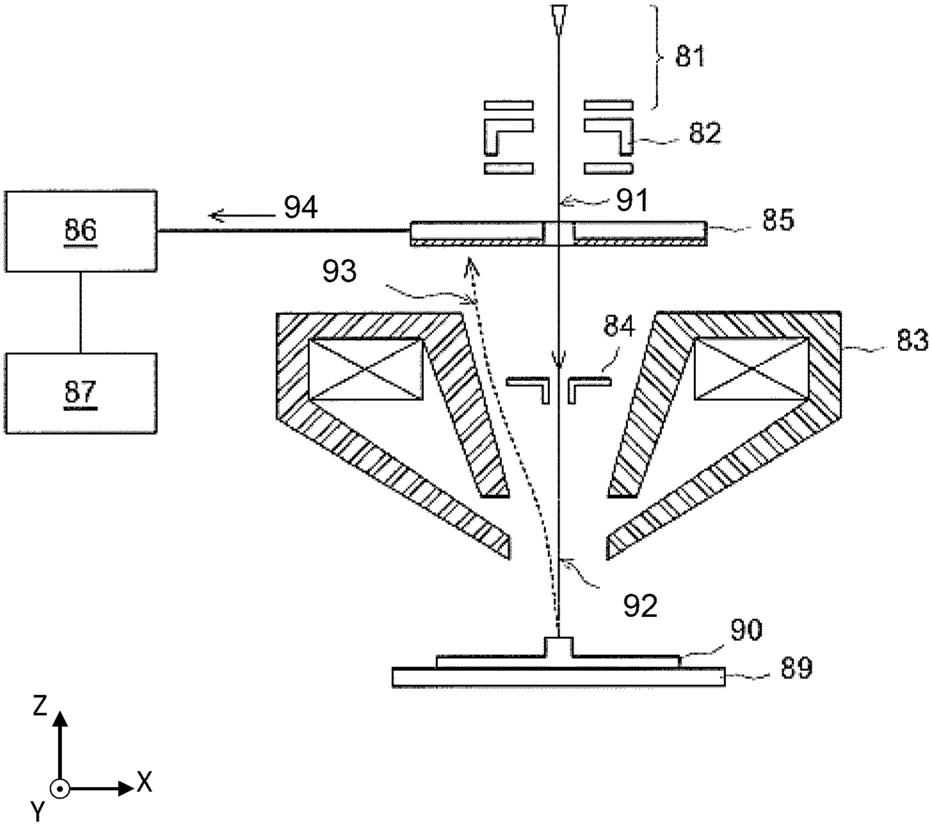
FIG. 18 schematically depicts an embodiment of an electron beam inspection apparatus, according to an embodiment.

FIG. 18 schematically illustrates a further embodiment of an inspection apparatus. The system is used to inspect a sample 90 (such as a substrate) on a sample stage 88 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 88. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

In an embodiment, a monitoring module 87 is coupled to the image forming module 86 of the image forming apparatus to monitor, control, etc. the patterning process and/or derive a parameter for patterning process design, control, monitoring, etc. using the scanned image of the sample 90 received from image forming module 86. So, in an embodiment, the monitoring module 87 is configured or programmed to cause execution of a method described herein. In an embodiment, the monitoring module 87 comprises a computing device. In an embodiment, the monitoring module 87 comprises a computer program to provide functionality herein and encoded on a computer readable medium forming, or disposed within, the monitoring module 87.

In an embodiment, like the electron beam inspection tool of FIG. 17 that uses a probe to inspect a substrate, the electron current in the system of FIG. 18 is significantly larger compared to, e.g., a CD SEM such as depicted in FIG. 17, such that the probe spot is large enough so that the inspection speed can be fast. However, the resolution may not be as high as compared to a CD SEM because of the large probe spot. In an embodiment, the above discussed inspection apparatus may be single beam or a multi-beam apparatus without limiting the scope of the present disclosure.

The SEM images, from, e.g., the system of FIG. 17 and/or FIG. 18, may be processed to extract contours that describe the edges of objects, representing device structures, in the image. These contours are then typically quantified via metrics, such as CD, at user-defined cut-lines. Thus, typically, the images of device structures are compared and quantified via metrics, such as an edge-to-edge distance (CD) measured on extracted contours or simple pixel differences between images.

Figure 19:
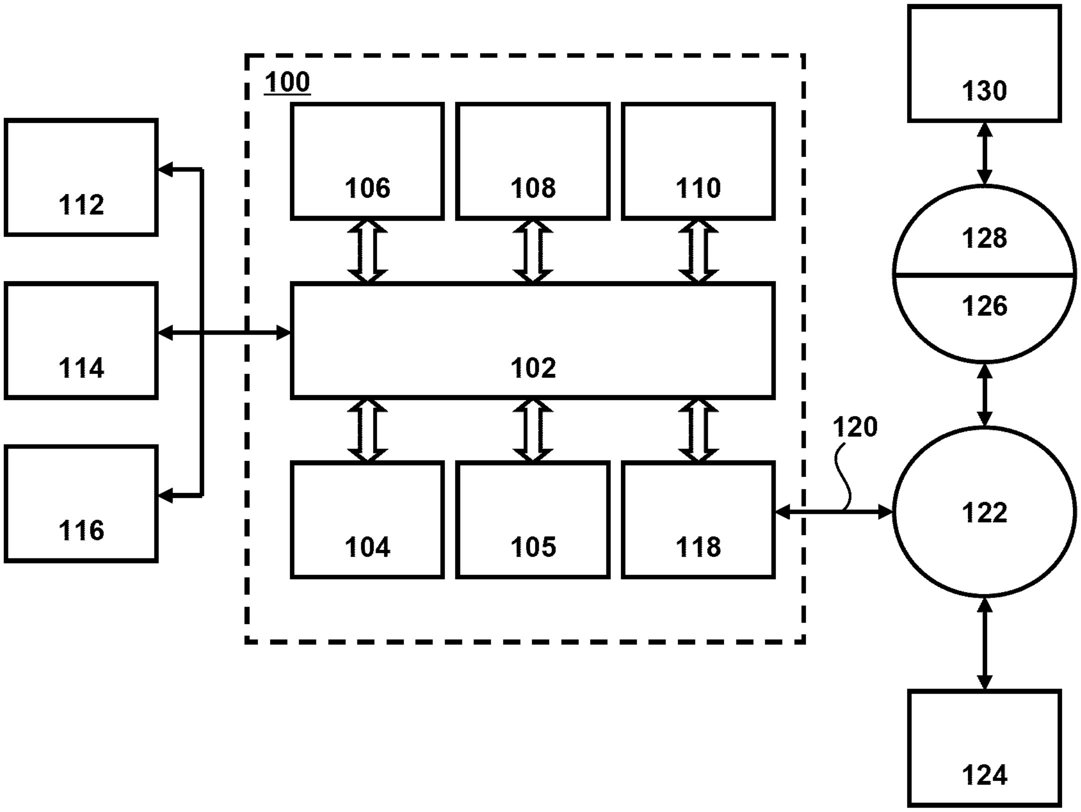
FIG. 19 is a block diagram of an example computer system, according to an embodiment.

FIG. 19 is a block diagram that illustrates a computer system 100 which can assist in implementing methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions.

The instructions received by main memory 106 may optionally be stored on storage device 110 either before or after execution by processor 104.

Computer system 100 also desirably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126.

ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are example forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 20:
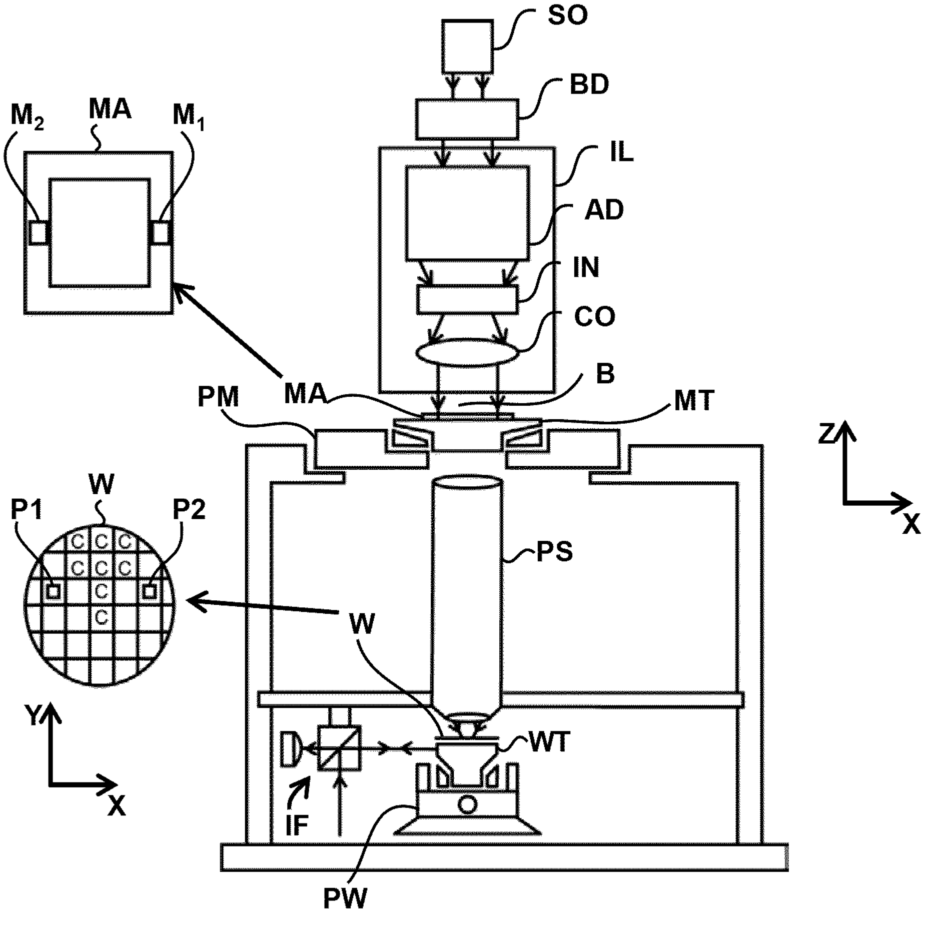
FIG. 20 is a schematic diagram of a lithographic projection apparatus, according to an embodiment.

FIG. 20 schematically depicts an exemplary lithographic projection apparatus in conjunction with the techniques described herein can be utilized. The apparatus comprises:

- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 20 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 20. However, in the case of a stepper (as opposed to a step-and-scan tool) the patterning device table MT may just be connected to a short stroke actuator, or may be fixed.

The depicted tool can be used in two different modes:

- In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 21:
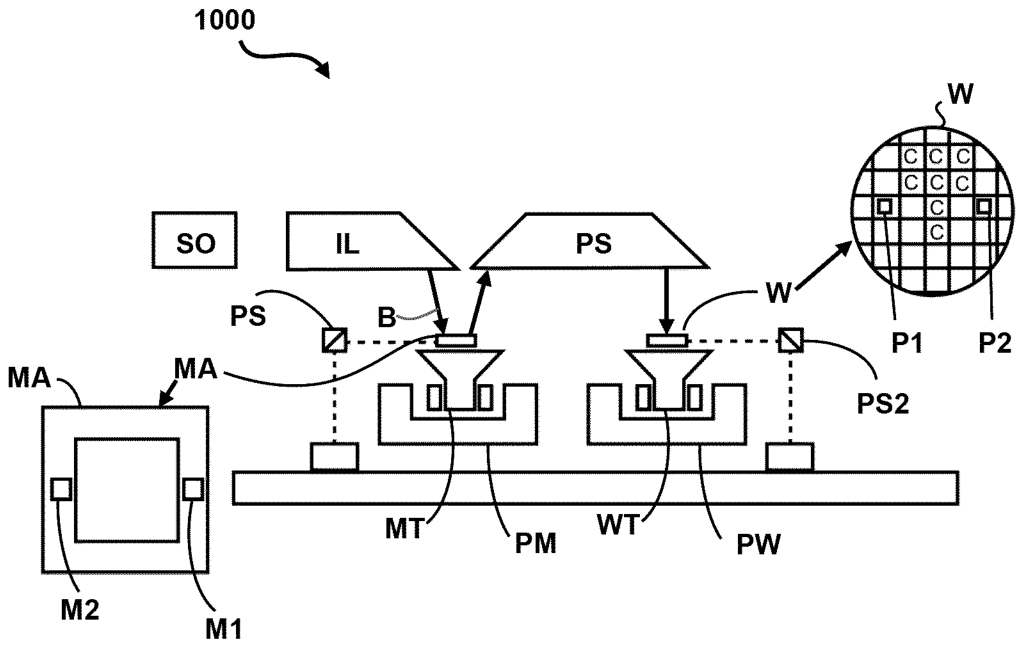
FIG. 21 is a schematic diagram of an extreme ultraviolet (EUV) lithographic projection apparatus, according to an embodiment.

FIG. 21 schematically depicts another exemplary lithographic projection apparatus 1000 that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective mask). It is to be noted that because most materials are absorptive within the EUV wavelength range, the patterning device may have multilayer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 21, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 21, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

FIG. 22 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 22.

Collector optic CO, as illustrated in FIG. 22, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Figure 23:
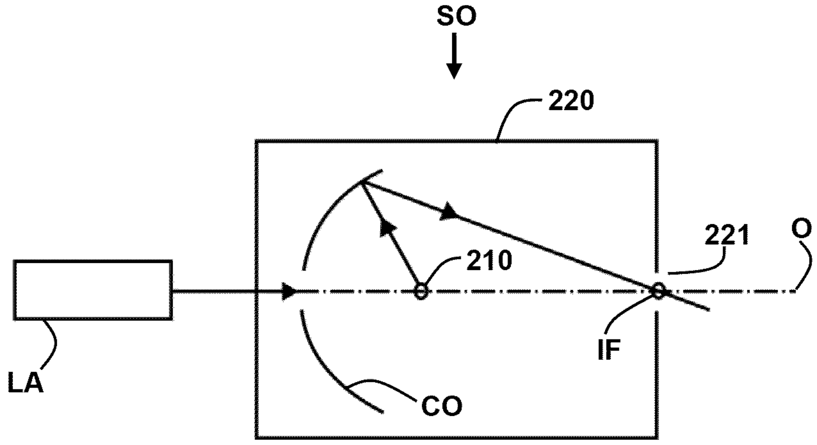
FIG. 23 is a more detailed view of the source collector module of the apparatus of FIG. 21 and FIG. 22, according to an embodiment.

Alternatively, the source collector module SO may be part of an LPP radiation system as shown in FIG. 23. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Embodiments of the present disclosure are further described in the following clauses.

1. A method of generating metrology gauges for measuring a physical characteristic of a structure printed on a substrate, the method comprising:
   obtaining (i) measured data associated with the physical characteristic of the structure printed on the substrate, and (ii) at least a portion of a simulated contour of the structure, the portion of the simulated contour being associated with the measured data;
   modifying, based on the measured data, the portion of the simulated contour of the structure; and
   generating the metrology gauges on or adjacent to the modified portion of the simulated contour, the metrology gauges being placed to measure the physical characteristic of the simulated contour of the structure.

2. The method of clause 1, wherein the portion of the simulated contour is part of the simulated contour within a defined region around the measured data associated with the structure 3. The method of clause 1, wherein the obtaining of the portion of the simulated contour comprises:
   defining, around a defined location associated with the measured data, a region of the substrate; and
   simulating, within the defined region of the substrate, a patterning process to obtain the portion of the simulated contour of the structure.

4. The method of any of clauses 1-3, wherein the modifying of the portion of the simulated contour comprises:
   determining, based on the portion of the simulated contour, simulated data associated with the physical characteristic of the simulated contour of the structure;
   determining a difference between the measured data and the simulated data associated with the physical characteristic of the structure; and
   modifying, based on the difference, the portion of the simulated contour such that the difference between the measured data and the simulated data is reduced.

5. The method of any of clauses 1-4, wherein the measured data is a CD value at the defined location associated with the structure.

6. The method of any of clauses 5, wherein the modifying of the portion of the simulated contour is based on the difference between simulated CD value and the measured CD value associated with the structure.

7. The method of any of clauses 1-6, wherein the modifying of the portion of the simulated contour comprises:
   determining, based on the portion of the simulated contour, simulated data associated with the physical characteristic of the simulated contour of the structure;
   determining a difference between the measured data and the simulated data associated with the physical characteristic of the structure; and
   adjusting, based on the difference, a threshold value employed to generate the simulated contour such that the difference between the measured data and the simulated data is reduced, wherein the adjusted threshold modifies the portion of the simulated contour.

8. The method of any of clauses 1-7, wherein the modifying of the portion of the simulated contour comprises:
   determining, using the portion of the simulated contour, a simulated CD value at the defined location associated with a measured CD value;
   determining a difference between the simulated CD value and the measured CD value; and
   adjusting, based on the difference, the threshold value such that the difference between the CD values is reduced, the adjusted threshold value modifying the portion of the simulated contour;

9. The method of any of clauses 1-8, wherein the generating the metrology gauges comprises:

specifying points along the modified portion of the simulated contour; and exporting location of the points as the metrology gauges.

10. The method of any of clauses 1-9, wherein the measured data is obtained via a metrology tool.

11. The method of clause 9, wherein the metrology tool is a scanning electron microscope (SEM) and the measured data is obtained from a SEM image.

12. The method of any of clauses 1-11, wherein the metrology gauges are edge placement gauges and/or CD gauges.

13. A method for determining hotspot locations associated with a substrate, the method comprising:

obtaining (i) a simulated contour associated with one or more patterns, the simulated contour being associated with measured data of a physical characteristic of the one or more patterns printed on the substrate, and (ii) metrology gauges associated with the simulated contour;

determining, based on the metrology gauges, values of the physical characteristic associated with the one or more patterns; and determining, based on the physical characteristic values, the hotspot locations on the substrate, wherein a hotspot location is a location on the substrate where a physical characteristic value is less than a hotspot threshold value associated with the one or more patterns.

14. The method of clause 13, wherein the obtaining the metrology gauges comprises:

determining, via simulating a patterning process using the measured data, a simulated contour associated with the one or more patterns;

modifying at least a portion of the simulated contour based on the measured data associated with the one or more patterns; and generating the metrology gauges along the modified portion of the simulated contour.

15. The method of any of clauses 13-14, wherein determining values of the physical characteristic comprises:

measuring, at one or more of the metrology gauges, values of the physical characteristic.

16. The method of clause 15, wherein determining the hotspot locations comprises:

determining whether a value of the physical characteristic associated with the one or more patterns breaches the hotspot threshold value;

responsive to breaching of the threshold value, identifying the location of the metrology gauges associated with breaching of the threshold value.

17. A method for training a model associated with a patterning process, the method comprising:

obtaining (i) measured data associated with the physical characteristic of the structure printed on the substrate, and (ii) metrology gauges associated with a simulated contour of a structure to be printed on a substrate, the simulated contour being associated with a defined location on the substrate where the physical characteristic is measured; and training, using the measured data and the metrology gauges, the model such that a performance metric of the patterning process is improved around the defined location on the substrate, the performance metric being a function of the metrology gauges and the physical characteristic.

18. The method of clause 17, wherein the training of the model is an iterative process, an iteration comprises:

determining, via executing the model, a simulated contour of the structure to be printed on the substrate and simulated data associated with the physical characteristic of the simulated contour of the structure;

determining a first difference between the simulated data and the measured data, and a second difference between points along the simulated contour and the metrology gauges; and determining, based on a gradient of the performance metric with parameters of the patterning process, model parameters such that the performance metric is minimized, the performance metric being a function of the first difference and the second difference.

19. The method of clause 18, wherein the model is at least one of:

an etch model configured to predict an etch image; or a resist model configured to predict a resist image.

20. A method of generating metrology gauges for measuring a physical characteristic of a structure on a substrate, the method comprising:

obtaining (i) measured data associated with the physical characteristic of the structure printed on the substrate, and (ii) at least portion of a simulated contour of the structure, the portion of the simulated contour being associated with the measured data;

generating, based on the measured data, a modified contour of the portion of the simulated contour of the structure; and providing the modified contour to a model of the patterning process to determine parameters of the patterning process.

21. The method of clause 20, wherein the generating the modified contour of the portion of the simulated contour comprises:

determining, based on the portion of the simulated contour, simulated data associated with the physical characteristic of the simulated contour of the structure;

determining a difference between the measured data and the simulated data associated with the physical characteristic of the structure; and modifying, based on the difference, the portion of the simulated contour such that the difference between the measured data and the simulated data is reduced.

22. A computer program product comprising a non-transitory computer readable medium having instructions recorded thereon, the instructions when executed by a computer implementing the method of any of the above clauses.

23. A method of training a machine learning model associated with a patterning process, the method comprising:

obtaining (i) contour data of an after development image (ADI) pattern on a substrate, (ii) measured data of an after etch image (AEI) pattern printed on the substrate, and (iii) reference bias values based on the contour data of the ADI pattern and the measured data of the AEI pattern; and training, using the measured data and the contour data as training data, the machine learning model to determine bias values to be applied to an ADI contour.

24. The method of clause 23, wherein the training comprising:

adjusting model parameters of the machine learning model to cause the bias values to be in a specified range that is determined based on the reference bias values.

25. The method of clause 23, wherein the machine learning model is configured to generate a representation of a bias map for the ADI contour.

26. The method according to clause 23, wherein the contour data represent images of contours associated with one or more features in the ADI pattern.

27. The method according to clause 26, wherein the images are generated from simulated contours of a simulated ADI pattern, and/or obtained from a metrology apparatus configured to capture an image of the substrate after preforming a resist process on the substrate.

28. The method according to any of clauses 23-27, wherein the obtaining of the contour data comprises:

executing, using a design pattern to be printed on the substrate as input, one or more process model associated with the patterning process to generate the simulated ADI pattern, the patterning process comprising a resist process; and extracting contours from the simulated ADI pattern, each contour being a contour of a feature within the simulated ADI pattern.

29. The method according to clause 28, wherein the one or more process models comprise at least one of:

an optics model configured to determine an aerial image; and a resist model configured to determine a resist image.

30. The method according to any of clauses 23-29, wherein the measured data is obtained at metrology gauges, the metrology gauges being edge placement gauges, and/or critical dimension (CD) gauges associated with the AEI pattern.

31. The method according to clause 28, wherein the measured data at the metrology gauges comprises:

locations of the edge placement gauges associated with a contour of the AEI pattern printed on the substrate; and/or CD values associated with the AEI pattern printed on the substrate.

32. The method according to clause 28, wherein when the metrology gauges are CD gauges, the reference bias values are obtained via a calibration process configured to determine bias values associated with a given CD gauge, a bias value indicative of an amount of CD reduction to be applied to the ADI pattern to generate the AEI pattern.

33. The method according to clause 32, wherein the bias values are provided at ends of the given CD gauge, the bias values being not equal or asymmetric with respect to a center of the CD gauge.

34. The method according to any of clauses 23-33, wherein the training of the machine learning model is an iterative process, an iteration comprises:

(a) executing, using the measured data, the contour data, and given values of the model parameters, the machine learning model to generate the bias map associated with the contour data, the bias map comprising bias values;

(b) adjusting, based on a gradient of a difference between the model-based bias values and the reference bias values, the model parameters of the machine learning model such that the difference is reduced; and (c) performing steps (a)-b) until the difference is minimized.

35. The method according to clause 23-34, wherein the bias map, generated via a trained machine learning model, comprises etch bias values to be applied to a resist contour to determine an etch contour that will be printed on the substrate.

36. The method according to clause 35, wherein the etch bias values are applied in local normal directions to the resist contour.

37. The method according to any of clauses 23-36, wherein the bias map is a pixelated image, each pixel having intensity value indicative of a bias value.

38. A method for determining a bias vector associated with an after development image (ADI) pattern, the method comprising:

obtaining (i) a probability distribution function (PDF) corresponding to particles deposited within the ADI pattern on a substrate, and (ii) a contour function characterizing an ADI contour associated with the ADI pattern;

determining, based on a combination of the PDF of the particles and the contour function over an area of the ADI contour, a deposition rate of the particles at a specified location on the ADI contour; and determining, based on the deposition rate, a bias vector associated with the ADI pattern, the bias vector when applied to the ADI contour of the ADI pattern generates an after etch image (AEI) contour.

39. The method of clause 38, wherein the obtaining of the probability distribution function (PDF) of particles is based on measured substrate data, the measured substrate data comprising deposition data of particles, and measured etch pattern.

40. The method of clause 39, wherein the obtaining of the PDF comprises determining a variance of a Gaussian distribution that fits the measured data.

41. The method of any of clauses 38-40, wherein the determining of the deposition rate of the particles comprises:

convoluting the PDF of the particles and the contour function; and integrating over the area of the ADI contour.

42. The method of any of clauses 38-41, wherein determining of the bias vector comprises:

determining a gradient of the deposition rate with respect to a first direction and a second direction of the ADI pattern, the first direction and the second direction being perpendicular to each other.

43. The method of clause 38, wherein the bias vector comprises: a bias direction at a location of the ADI contour, and further comprising applying a bias value along to generate the AEI contour.

44. The method of clause 43, wherein the bias direction is determined such that when the bias values at different location are applied to the ADI contour, the bias vector at different locations do not intersect each other.

45. The method of clause 44, wherein the bias direction comprises: a direction that is not normal to the ADI contour.

46. The method of any of clauses 38-45, wherein the PDF of the particle represents a deposition or an etching process of the particles on the ADI contour, and wherein the deposition rate is positive or negative.

47. The method of any of clauses 43-46, wherein the bias values are obtained from a trained machine learning model configured to generated a bias map for a given resist pattern.

48. The method of any of clauses 38-47, wherein when the ADI pattern includes a plurality of contours, a set of bias vector are determined for each ADI contour individually.

49. A method for determining a bias vector for a contour, the method comprising:

obtaining (i) a probability distribution function (PDF) corresponding to a process to be performed on the contour, and (ii) a contour function characterizing a shape of the contour;

convoluting the contour function with the PDF over an area of the contour to determine a process rate at a specified location on the contour; and determining, based on the process rate, a bias vector to be applied to the contour for generating a biased contour that is indicative of an effect of the process applied on the contour.

50. The method of clause 49, wherein the process causes an addition or a removal of material in which the contour is formed, the addition or the removal causing a change in shape of the contour.

51. The method of clause 50, wherein the process rate characterizes a behavior of the addition or the removal of the material in which the contour is formed.

52. A non-transitory computer-readable media comprising instructions that, when executed by one or more processors, cause operations comprising:

obtaining (i) contour data of an after development image (ADI) pattern on a substrate, (ii) measured data of an after etch image (AEI) pattern printed on the substrate, and (iii) reference bias values based on the contour data of the ADI pattern and the measured data of the AEI pattern; and training, using the measured data and the contour data as training data, the machine learning model to determine bias values to be applied to an ADI contour.

53. The non-transitory computer-readable media of clause 52, wherein the training comprising:

adjusting model parameters of the machine learning model to cause the bias values to be in a specified range that is determined based on the reference bias values.

54. The non-transitory computer-readable media of clause 52, wherein the machine learning model is configured to generate a representation of a bias map for the ADI contour.

55. The non-transitory computer-readable media according to clause 52, wherein the contour data represent images of contours associated with one or more features in the ADI pattern.

56. The non-transitory computer-readable media according to clause 55, wherein the images are generated from simulated contours of a simulated ADI pattern, and/or obtained from a metrology apparatus configured to capture an image of the substrate after preforming a resist process on the substrate.

57. The non-transitory computer-readable media according to any of clauses 52-56, wherein the obtaining of the contour data comprises:

executing, using a design pattern to be printed on the substrate as input, one or more process model associated with the patterning process to generate the simulated ADI pattern, the patterning process comprising a resist process; and extracting contours from the simulated ADI pattern, each contour being a contour of a feature within the simulated ADI pattern.

58. The non-transitory computer-readable media according to clause 57, wherein the one or more process models comprise at least one of:

an optics model configured to determine an aerial image; and a resist model configured to determine a resist image.

59. The non-transitory computer-readable media according to any of clauses 52-58, wherein the measured data is obtained at metrology gauges, the metrology gauges being edge placement gauges, and/or critical dimension (CD) gauges associated with the AEI pattern.

60. The non-transitory computer-readable media according to clause 57, wherein the measured data at the metrology gauges comprises:

locations of the edge placement gauges associated with a contour of the AEI pattern printed on the substrate; and/or CD values associated with the AEI pattern printed on the substrate.

61. The non-transitory computer-readable media according to clause 57, wherein when the metrology gauges are CD gauges, the reference bias values are obtained via a calibration process configured to determine bias values associated with a given CD gauge, a bias value indicative of an amount of CD reduction to be applied to the ADI pattern to generate the AEI pattern.

62. The non-transitory computer-readable media according to clause 61, wherein the bias values are provided at ends of the given CD gauge, the bias values being not equal or asymmetric with respect to a center of the CD gauge.

63. The non-transitory computer-readable media according to any of clauses 52-62, wherein the training of the machine learning model is an iterative process, an iteration comprises:

(a) executing, using the measured data, the contour data, and given values of the model parameters, the machine learning model to generate the bias map associated with the contour data, the bias map comprising bias values;

(b) adjusting, based on a gradient of a difference between the model-based bias values and the reference bias values, the model parameters of the machine learning model such that the difference is reduced; and (c) performing steps (a)-b) until the difference is minimized.

64. The non-transitory computer-readable media according to clause 52-63, wherein the bias map, generated via a trained machine learning model, comprises etch bias values to be applied to a resist contour to determine an etch contour that will be printed on the substrate.

65. The non-transitory computer-readable media according to clause 64, wherein the etch bias values are applied in local normal directions to the resist contour.

66. The non-transitory computer-readable media according to any of clauses 52-66, wherein the bias map is a pixelated image, each pixel having intensity value indicative of a bias value.

67. A non-transitory computer-readable media comprising instructions that, when executed by one or more processors, cause operations comprising:

obtaining (i) a probability distribution function (PDF) corresponding to particles deposited within an after development image (ADI) pattern on a substrate, and (ii) a contour function characterizing an ADI contour associated with the ADI pattern;

determining, based on a combination of the PDF of the particles and the contour function over an area of the ADI contour, a deposition rate of the particles at a specified location on the ADI contour; and determining, based on the deposition rate, a bias vector associated with the ADI pattern, the bias vector when applied to the ADI contour of the ADI pattern generates an after etch image (AEI) contour.

68. The non-transitory computer-readable media of clause 67, wherein the obtaining of the probability distribution function (PDF) of particles is based on measured substrate data, the measured substrate data comprising deposition data of particles, and measured etch pattern.

69. The non-transitory computer-readable media of clause 68, wherein the obtaining of the PDF comprises determining a variance of a Gaussian distribution that fits the measured data.

70. The non-transitory computer-readable media of any of clauses 67-69, wherein the determining of the deposition rate of the particles comprises:

convoluting the PDF of the particles and the contour function; and integrating over the area of the ADI contour.

71. The non-transitory computer-readable media of any of clauses 67-70, wherein determining of the bias vector comprises:

determining a gradient of the deposition rate with respect to a first direction and a second direction of the ADI pattern, the first direction and the second direction being perpendicular to each other.

72. The non-transitory computer-readable media of clause 67, wherein the bias vector comprises: a bias direction at a location of the ADI contour, and further comprising applying a bias value along to generate the AEI contour.

73. The non-transitory computer-readable media of clause 72, wherein the bias direction is determined such that when the bias values at different location are applied to the ADI contour, the bias vector at different locations do not intersect each other.

74. The non-transitory computer-readable media of clause 73, wherein the bias direction comprises: a direction that is not normal to the ADI contour.

75. The non-transitory computer-readable media of any of clauses 67-74, wherein the PDF of the particle represents a deposition or an etching process of the particles on the ADI contour, and wherein the deposition rate is positive or negative.

76. The non-transitory computer-readable media of any of clauses 67-75, wherein the bias values are obtained from a trained machine learning model configured to generated a bias map for a given resist pattern.

77. The non-transitory computer-readable media of any of clauses 67-76, wherein when the ADI pattern includes a plurality of contours, a set of bias vector are determined for each ADI contour individually.

78. A non-transitory computer-readable media comprising instructions that, when executed by one or more processors, cause operations comprising:

obtaining (i) a probability distribution function (PDF) corresponding to a process to be performed on a contour, and (ii) a contour function characterizing a shape of the contour;

convoluting the contour function with the PDF over an area of the contour to determine a process rate at a specified location on the contour; and determining, based on the process rate, a bias vector to be applied to the contour for generating a biased contour that is indicative of an effect of the process applied on the contour.

79. The non-transitory computer-readable media of clause 78, wherein the process causes an addition or a removal of material in which the contour is formed, the addition or the removal causing a change in shape of the contour.

80. The non-transitory computer-readable media of clause 79, wherein the process rate characterizes a behavior of the addition or the removal of the material in which the contour is formed.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms “reticle”, “wafer” or “die” herein may be considered as synonymous or interchangeable with the more general terms “patterning device”, “substrate” or “target portion”, respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multilayer IC, so that the term substrate used herein may also refer to a substrate that already contains multiple processed layers.

In the present document, the terms “radiation” and “beam” as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms “optimizing” and “optimization” as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term “optimizing” and “optimization” as used herein refers to or means a process that identifies one or more values for one or more parameters that provide an improvement, e.g. a local optimum, in at least one relevant metric, compared to an initial set of one or more values for those one or more parameters. “Optimum” and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method for metrology, the method comprising:

obtaining (i) measured data associated with a physical characteristic of a structure printed on a substrate, and (ii) at least a portion of a simulated contour of the structure, the at least a portion of the simulated contour being associated with the measured data;

modifying, based on the measured data and by a hardware computer, the at least a portion of the simulated contour of the structure without re-simulation of the simulated contour; and generating metrology gauges on or adjacent to the modified at least a portion of the simulated contour, the metrology gauges being placed to measure the physical characteristic of the simulated contour of the structure.

2. The method of claim 1, wherein the at least a portion of the simulated contour is part of the simulated contour within a defined region around the measured data associated with the structure.

3. The method of claim 2, wherein the obtaining of the at least a portion of the simulated contour comprises:

defining, around a defined location associated with the measured data, a region of the substrate; and simulating, within the defined region of the substrate, a patterning process to obtain the at least a portion of the simulated contour of the structure.

4. The method of claim 1, wherein the modifying of the at least a portion of the simulated contour comprises:

determining, based on the at least a portion of the simulated contour, simulated data associated with the physical characteristic of the simulated contour of the structure;

determining a difference between the measured data and the simulated data associated with the physical characteristic of the structure; and modifying, based on the difference, the at least a portion of the simulated contour such that the difference between the measured data and the simulated data is reduced.

5. The method of claim 1, wherein the measured data is a CD value at a defined location associated with the structure.

6. The method of claim 5, wherein the modifying of the at least a portion of the simulated contour is based on a difference between a simulated CD value and the measured CD value associated with the structure.

7. The method of claim 1, wherein the modifying of the at least a portion of the simulated contour comprises:

determining, based on the at least a portion of the simulated contour, simulated data associated with the physical characteristic of the simulated contour of the structure;

determining a difference between the measured data and the simulated data associated with the physical characteristic of the structure; and adjusting, based on the difference, a threshold value employed to generate the simulated contour such that the difference between the measured data and the simulated data is reduced, wherein the adjusted threshold is used to modify the at least a portion of the simulated contour.

8. The method of claim 1, wherein the modifying of the at least a portion of the simulated contour comprises:

determining, using the at least a portion of the simulated contour, a simulated CD value at a defined location associated with a measured CD value;

determining a difference between the simulated CD value and the measured CD value; and adjusting, based on the difference, a threshold value such that the difference between the simulated CD value and the measured CD value is reduced, the adjusted threshold value is used to modify the at least a portion of the simulated contour.

9. The method of claim 1, wherein the generating the metrology gauges comprises:

specifying points along the modified at least a portion of the simulated contour; and exporting location of the points as the metrology gauges.

10. The method of claim 1, wherein the measured data is obtained via a metrology tool.

11. The method of claim 10, wherein the metrology tool is a scanning electron microscope (SEM) and the measured data is obtained from a SEM image.

12. The method of claim 1, wherein the metrology gauges are edge placement gauges and/or CD gauges.

13. The method of claim 1, further comprising providing the modified contour to a model of a patterning process to determine one or more parameters of the patterning process.

14. The method of claim 3, further comprising training a machine learning model associated with a patterning process, the training comprising training, using the measured data and the metrology gauges, the machine learning model such that a performance metric of the patterning process is improved around the defined location on the substrate, the performance metric being a function of the metrology gauges and the physical characteristic, wherein the machine learning model is an etch model or a resist model.

15. A computer program product comprising a non-transitory computer readable medium having instructions therein, the instructions, when executed by a computer system, configured to cause the computer system to at least:

obtain (i) measured data associated with physical characteristic of a structure printed on a substrate, and (ii) at least a portion of a simulated contour of the structure, the at least a portion of the simulated contour being associated with the measured data;

modify, based on the measured data, the at least a portion of the simulated contour of the structure without re-simulation of the simulated contour; and generate metrology gauges on or adjacent to the modified at least a portion of the simulated contour, the metrology gauges being placed to measure the physical characteristic of the simulated contour of the structure.

16. The computer program product of claim 15, wherein the at least a portion of the simulated contour is part of the simulated contour within a defined region around the measured data associated with the structure.

17. The computer program product of claim 16, wherein the instructions configured to cause the computer system to obtain the at least a portion of the simulated contour are further configured to cause the computer system to:

define, around a defined location associated with the measured data, a region of the substrate; and simulate, within the defined region of the substrate, a patterning process to obtain the at least a portion of the simulated contour of the structure.

18. The computer program product of claim 15, wherein the instructions configured to cause the computer system to modify the at least a portion of the simulated contour are further configured to cause the computer system to:

determine, based on the at least a portion of the simulated contour, simulated data associated with the physical characteristic of the simulated contour of the structure;

determine a difference between the measured data and the simulated data associated with the physical characteristic of the structure; and modify, based on the difference, the at least a portion of the simulated contour such that the difference between the measured data and the simulated data is reduced.

19. The computer program product of claim 15, wherein the instructions configured to cause the computer system to modify the at least a portion of the simulated contour are further configured to cause the computer system to:

determine, based on the at least a portion of the simulated contour, simulated data associated with the physical characteristic of the simulated contour of the structure;

determine a difference between the measured data and the simulated data associated with the physical characteristic of the structure; and adjust, based on the difference, a threshold value employed to generate the simulated contour such that the difference between the measured data and the simulated data is reduced, wherein the adjusted threshold is used to modify the at least a portion of the simulated contour.

20. The computer program product of claim 15, wherein the instructions configured to cause the computer system to modify the at least a portion of the simulated contour are further configured to cause the computer system to:

determine, using the at least a portion of the simulated contour, a simulated CD value at a defined location associated with a measured CD value;

determine a difference between the simulated CD value and the measured CD value; and adjust, based on the difference, a threshold value such that the difference between the simulated CD value and the measured CD value is reduced, the adjusted threshold value is used to modify the at least a portion of the simulated contour.

* * * * *